(12) United States Patent
Sato et al.

(10) Patent No.: US 11,955,170 B2
(45) Date of Patent: Apr. 9, 2024

(54) LOW-POWER STATIC RANDOM ACCESS MEMORY

(71) Applicant: UNTETHER AI CORPORATION, Toronto (CA)

(72) Inventors: Katsuyuki Sato, Tokyo (JP); William Martin Snelgrove, Toronto (CA); Saijagan Saijagan, Whitby (CA); Joseph Francis Rohlman, Iowa City, IA (US)

(73) Assignee: UNTETHER AI CORPORATION, Toronto (CA)

( * ) Notice: Subject to any disclaimer, the term of this patent is extended or adjusted under 35 U.S.C. 154(b) by 0 days.

(21) Appl. No.: 18/235,954

(22) Filed: Aug. 21, 2023

(65) Prior Publication Data
US 2023/0420040 A1 Dec. 28, 2023

Related U.S. Application Data

(63) Continuation of application No. 18/000,694, filed as application No. PCT/IB2022/055760 on Jun. 21, 2022.
(Continued)

(51) Int. Cl.
*G11C 11/418* (2006.01)
*G11C 11/4074* (2006.01)
(Continued)

(52) U.S. Cl.
CPC ........ *G11C 11/418* (2013.01); *G11C 11/4074* (2013.01); *G11C 11/4085* (2013.01);
(Continued)

(58) Field of Classification Search
CPC ............................ G11C 11/412; G11C 11/419
(Continued)

(56) References Cited

U.S. PATENT DOCUMENTS 5,008,609 A    4/1991 Fukiage
5,091,889 A *  2/1992 Hamano ............... G11C 11/418
                                                365/233.5
(Continued)

FOREIGN PATENT DOCUMENTS

WO    WO-2020182983 A1    9/2020

OTHER PUBLICATIONS

Zhang, Hanzun, et al. "A low-Power SRAM with charge cycling based read and write assist scheme." 2020 IEEE 15th International Conference on Solid-State & Integrated Circuit Technology (ICSICT). IEEE, 2020.
(Continued)

*Primary Examiner* — Sung Il Cho
(74) *Attorney, Agent, or Firm* — PERRY + CURRIER INC.

(57) ABSTRACT

A static random-access memory is set forth comprising: a word line circuit for generating a word line signal on a word line; a plurality of six-transistor memory cells arranged between a first bitline, a second bitline and the word line for simultaneously selecting one of either all or a portion of the plurality of six-transistor memory cells for data reading or writing, and wherein each memory cell includes first and second n-channel transistors and a bitline precharge circuit for precharging the first bitline and second bitline to a voltage of Vdd/2 prior to the first and second n-channel transistors receiving the word line signal.

12 Claims, 38 Drawing Sheets

Related U.S. Application Data

(60) Provisional application No. 63/228,698, filed on Aug. 3, 2021, provisional application No. 63/213,394, filed on Jun. 22, 2021, provisional application No. 63/213,393, filed on Jun. 22, 2021.

(51) Int. Cl.

| | | |
|---|---|---|
| *G11C 11/408* | (2006.01) | |
| *G11C 11/4094* | (2006.01) | |
| *G11C 11/4096* | (2006.01) | |
| *G11C 11/412* | (2006.01) | |
| *G11C 11/419* | (2006.01) | |

(52) U.S. Cl.
CPC ...... *G11C 11/4094* (2013.01); *G11C 11/4096* (2013.01); *G11C 11/412* (2013.01); *G11C 11/419* (2013.01)

(58) Field of Classification Search
USPC .......................................................... 365/154
See application file for complete search history.

(56) References Cited

U.S. PATENT DOCUMENTS

| | | | |
|---|---|---|---|
| 5,956,274 A | 9/1999 | Elliott et al. | |
| 6,279,088 B1 | 8/2001 | Elliott et al. | |
| 6,560,684 B2 | 5/2003 | Elliott et al. | |
| 7,155,581 B2 | 12/2006 | Elliott et al. | |
| 10,175,839 B2 | 1/2019 | Srivastava et al. | |
| 10,331,282 B2 | 6/2019 | Srivastava et al. | |
| 10,916,275 B1 | 2/2021 | Ghosh et al. | |
| 2010/0265778 A1 | 10/2010 | Yasuda | |
| 2012/0014172 A1 | 1/2012 | Jung et al. | |
| 2012/0014173 A1 | 1/2012 | Deng | |
| 2012/0314468 A1 | 12/2012 | Siau et al. | |
| 2013/0148414 A1 | 6/2013 | Shu et al. | |
| 2014/0016402 A1 | 1/2014 | Burnett et al. | |
| 2014/0210511 A1 | 7/2014 | Bartling et al. | |
| 2016/0118091 A1* | 4/2016 | Asenov | G11C 11/418 365/194 |
| 2017/0206949 A1 | 7/2017 | Pickering | |
| 2019/0147942 A1 | 5/2019 | Jain et al. | |
| 2019/0305971 A1* | 10/2019 | Li | G11C 7/02 |
| 2019/0340069 A1 | 11/2019 | Kumar et al. | |
| 2021/0149763 A1 | 5/2021 | Ranganathan et al. | |

OTHER PUBLICATIONS

Chen et al. "A 16 nm 128 Mb SRAM in High-$\kappa$ metal-gate FinFET technology with write-assist circuitry for low-VMIN applications." IEEE Journal of Solid-State Circuits 50.1 (2014): 170-177.
PCT/IB2022/055759, Low-Power Static Random Access Memory, filed Jun. 21, 2022.
U.S. Appl. No. 18/251,251, Low-Power Static Random Access Memory, filed May 1, 2023.
U.S. Appl. No. 18/235,935, Low-Power Static Random Access Memory, filed Aug. 21, 2023.
PCT/IB2022/055760, Low-Power Static Random Access Memory, filed Jun. 21, 2022.
U.S. Appl. No. 18/000,694, Low-Power Static Random Access Memory, filed Dec. 5, 2022.

* cited by examiner

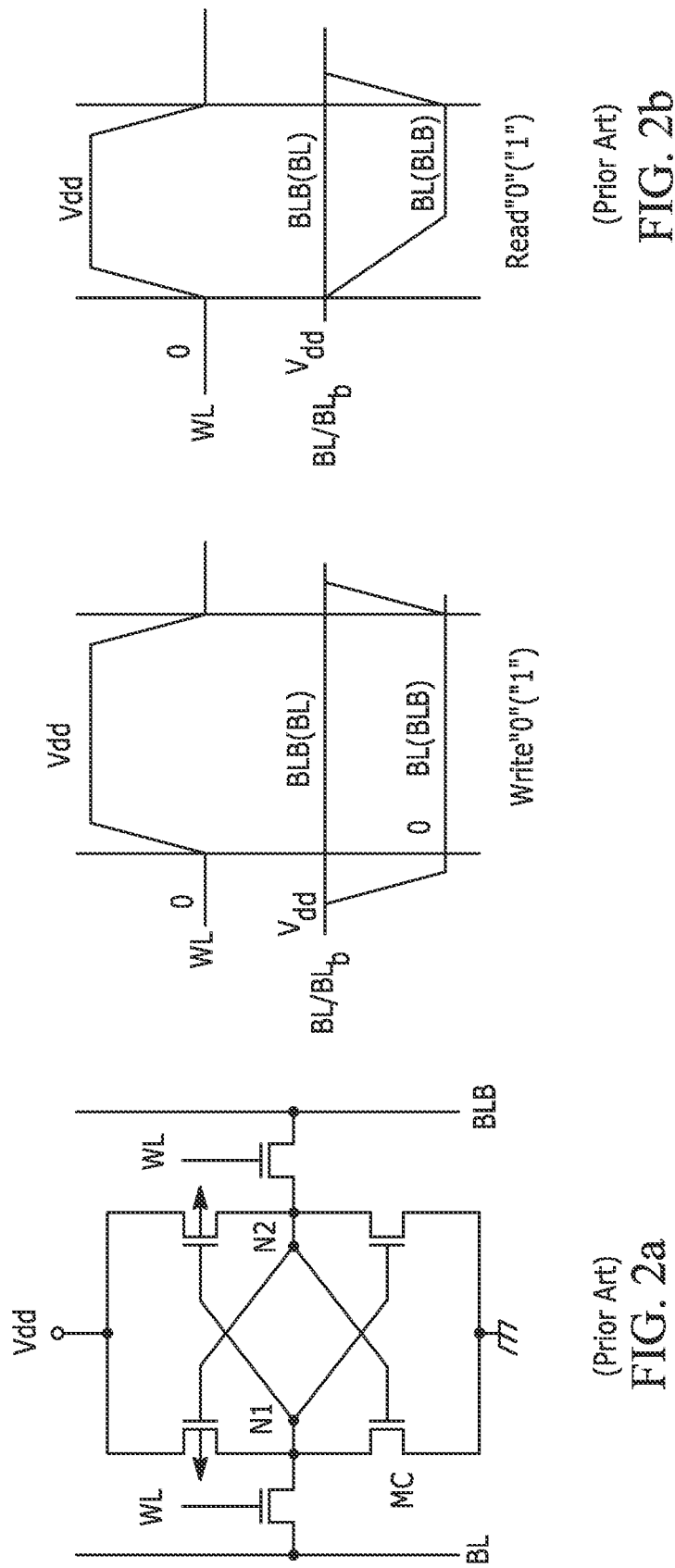

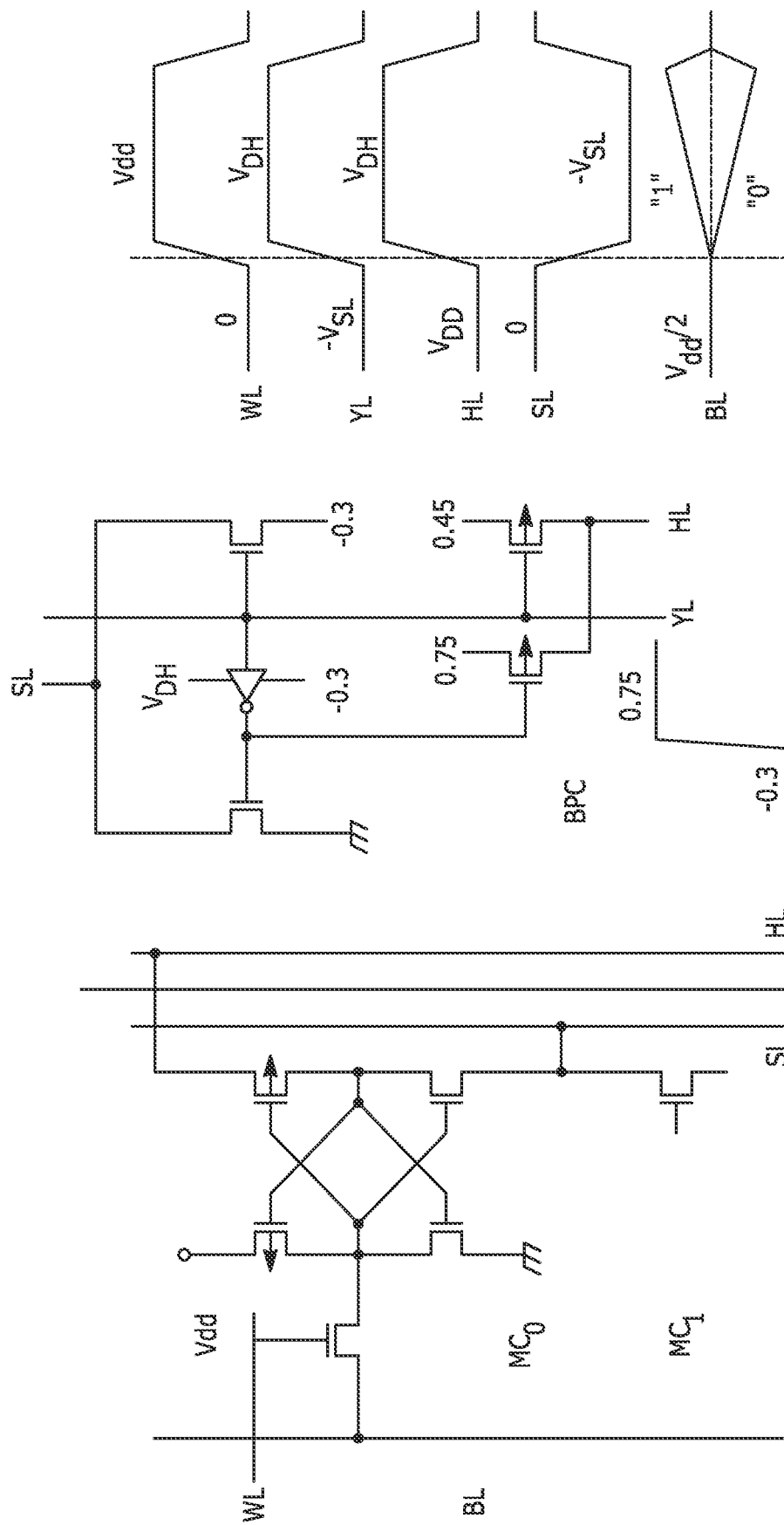

Trend Of SRAM Voltage Scaling For Low Power
(Prior Art)

SNM Dependency On Word-Line Voltage, $V_{WL}$, Of 6T SRAM

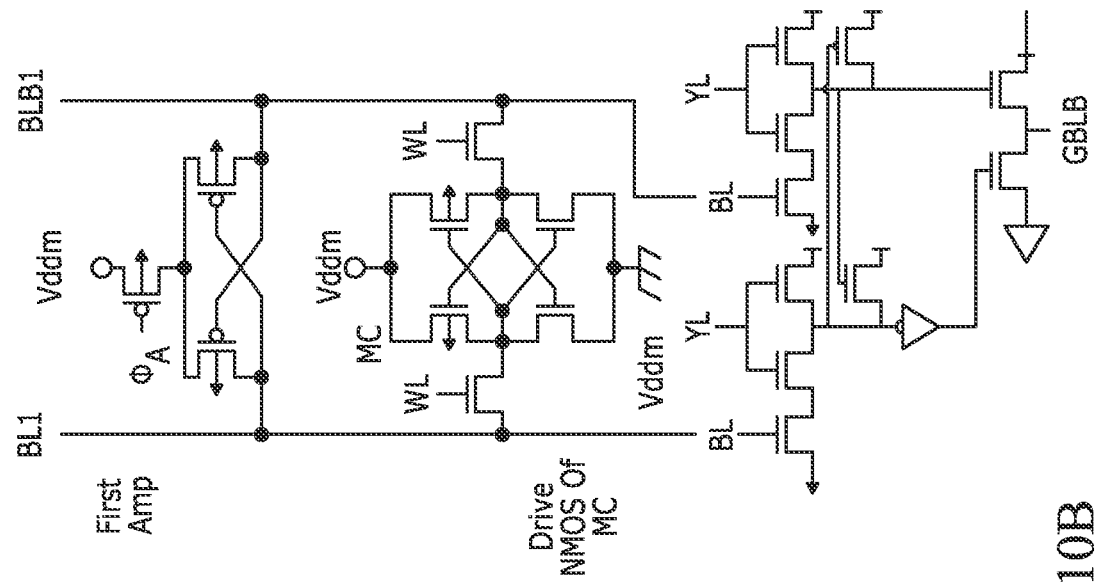
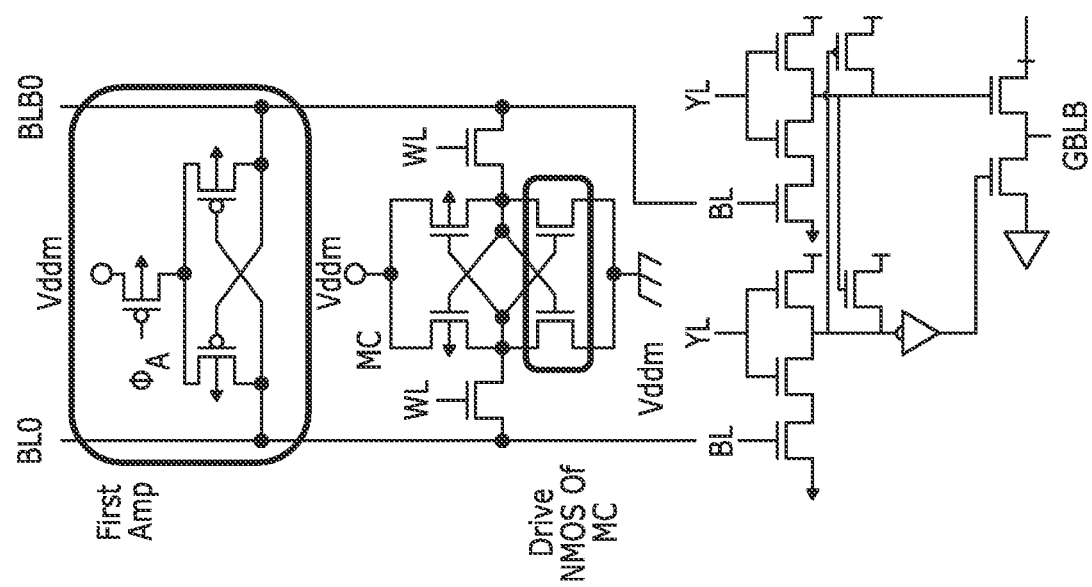
FIG. 10B

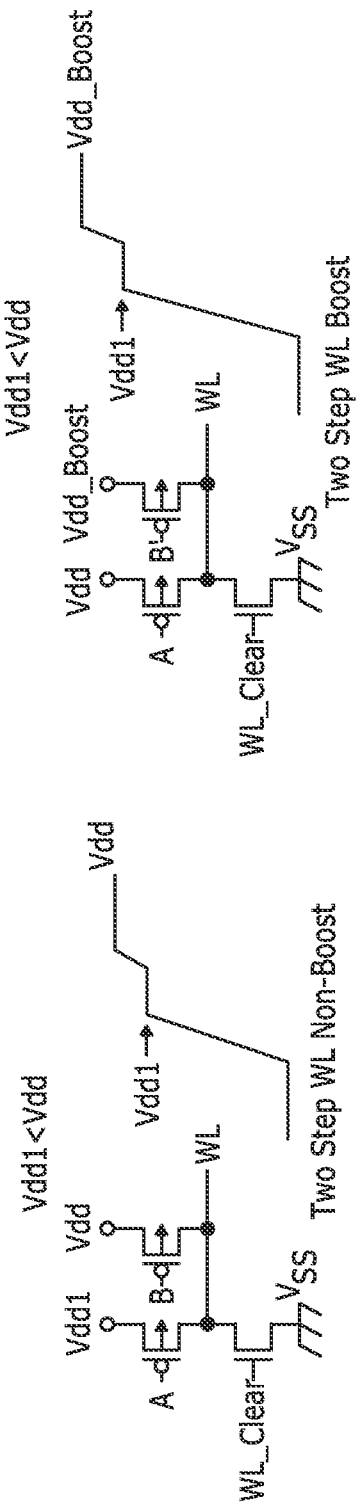
FIG. 12a-1 Two Step WL Non-Boost
FIG. 12a-2 Two Step WL Boost
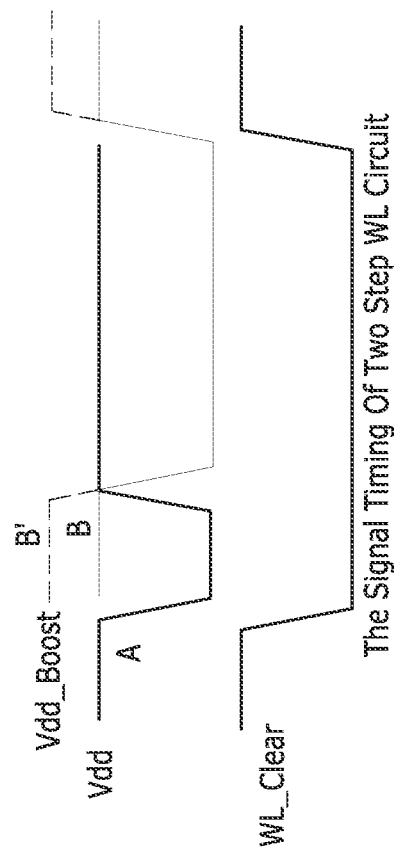
FIG. 12b The Signal Timing Of Two Step WL Circuit

LOW-POWER STATIC RANDOM ACCESS MEMORY

CROSS-REFERENCE TO RELATED APPLICATION(S)

This application is a continuation of U.S. patent application Ser. No. 18/000,694, filed Jun. 21, 2022, which is a 371 continuation of PCT/IB2022/055760, filed Jun. 21, 2022, which claims priority to U.S. Patent Application 63/213,393, filed Jun. 22, 2021 and U.S. Patent Application 63/213,394, filed Jun. 22, 2021, and U.S. Patent Application 63/228,698, filed Aug. 3, 2021 the contents of which are incorporated herein by reference.

BACKGROUND OF THE INVENTION

1. Field of the Invention

The present invention is directed to static random access memory (hereinafter SRAM), and more particularly to a six-transistor static random access memory with bit-line precharge and optimized word line voltages for reading and writing to the memory.

2. Description of the Related Art

There has been an ever-increasing need to reduce power dissipation in traditional SRAMs, wherein a plurality of memory cells (hereinafter MCs) along a selected word-line (hereinafter WL) are simultaneously read or written, while the rest, referred to as half-select MCs, are virtually read or written. Recently, this need has become more pressing with the introduction of emerging SRAMs used in AI-chips, wherein all of the MCs are simultaneously read or written for massively parallel operations between processor element blocks and the SRAMs.

The traditional folded-bitline (hereinafter BL) six-transistor MC (hereinafter 6T SRAM) is suitable for such emerging SRAMs due their simple and well-established design. Such 6T SRAMs employ a full-Vdd bitline (BL) precharge scheme (hereinafter F-BP) and non-boosted WL pulse ($V_{WL}$=Vdd) using two symmetric CMOS inverters forming a flip-flop, as discussed below. However, such 6T SRAMs suffer from problems regarding the BL-power and the read/write signal margins. The BL-power is derived from a large BL-swing of Vdd. To reduce the power, a Vdd/2-BL precharge scheme (hereinafter H-BP) has been used widely with DRAM memory (see Y. Nakagome et al, "An Experiment 1.5V 64 Mb DRAM", FIG. 10, on page 469, IEEE JSSC Vol. 26, No. 4, April, 1991, pp. 465-472, FIG. 5 on page 467). This approach has also been used with a unique 5T-SRAM memory (see K. Itoh et al., "0.5-V Sub-ns Open-BL SRAM Array with Mid-Point-Sensing Multi-Power 5T Cell", ISCAS Proc. pp. 2892-2895, May 2015). However, application of this approach to conventional 6T SRAM results in poor noise margin when reading the memory cell, which leads to unstable read operations because precharging the BLs to Vdd/2 during the read cycle increases the possibility of an erroneous flip of data (see K. Kanda et al., "90% write power-saving SRAM using sense-amplifying memory cell", IEEE JSSC Vol. 39, No. 6, pp. 927-933, June, 2004). Consequently, the H-BP approach has not been adopted for 6T SRAMs.

SUMMARY OF THE INVENTION

It is an aspect of the present invention to provide a static random-access memory comprising: a word line circuit for generating a word line signal on a word line; a plurality of six-transistor memory cells arranged between a first bitline, a second bitline and the word line for simultaneously selecting one of either all or a portion of the plurality of six-transistor memory cells for data reading or writing, and wherein each memory cell comprises: a first inverter; a second inverter, the first inverter and the second inverter configured to operate at a power supply voltage (Vdd); a first n-channel transistor having a gate for receiving the word line signal on the word line and in response connecting a first output of the first inverter to the first bitline; a second n-channel transistor having a gate for receiving the word line signal on the word line and in response connecting a second output of the second inverter to the second bitline; and a bitline precharge circuit for precharging the first bitline and second bitline to a voltage of Vdd/2 prior to the first and second n-channel transistors receiving the word line signal.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1b shows column precharge multiplexer and sense/write amplifiers of the prior art SRAM cell array depicted in FIG. 1a.

FIG. 2a shows a prior art folded-BL six-transistor MC (6T SRAM), and FIG. 2b depicts timing of the WL and BL signals therefor, using full-Vdd bitline (BL) precharge.

FIG. 3a shows a 5T-SRAM memory according to the prior art, FIG. 3b shows a Vdd/2 bitline precharge circuit (H-BP) for the 5T-SRAM memory, and FIG. 3c depicts timing of the WL and BL operating signals therefor.

FIG. 7a is directed to read operations and FIG. 7b is directed to write operations.

FIG. 8a is a timing diagram at $V_{WL}$=550 mV, FIG. 8b is a timing diagram at $V_{WL}$=700 mV, and FIG. 8c shows dependency of BLB fall time (tf), N2 peak and N1 dip on $V_{WL}$.

FIG. 9a is directed to read operations and FIG. 9b is directed to write operations.

FIG. 10b shows a BL amplifier adapted for low voltage operation, according to an alternative embodiment.

FIGS. 12a-1 and 12a-2, show a two-step WL circuit according to an embodiment, where FIG. 12a-1 shows Vdd being used for the second step WL, FIG. 12a-2 shows a boosted voltage applied for the second WL step, and FIG. 12b shows two different timing signals, A and B, for connecting two different voltage supplies, Vdd and Vdd1.

DETAILED DESCRIPTION OF THE PREFERRED EMBODIMENTS

Figure 1A:
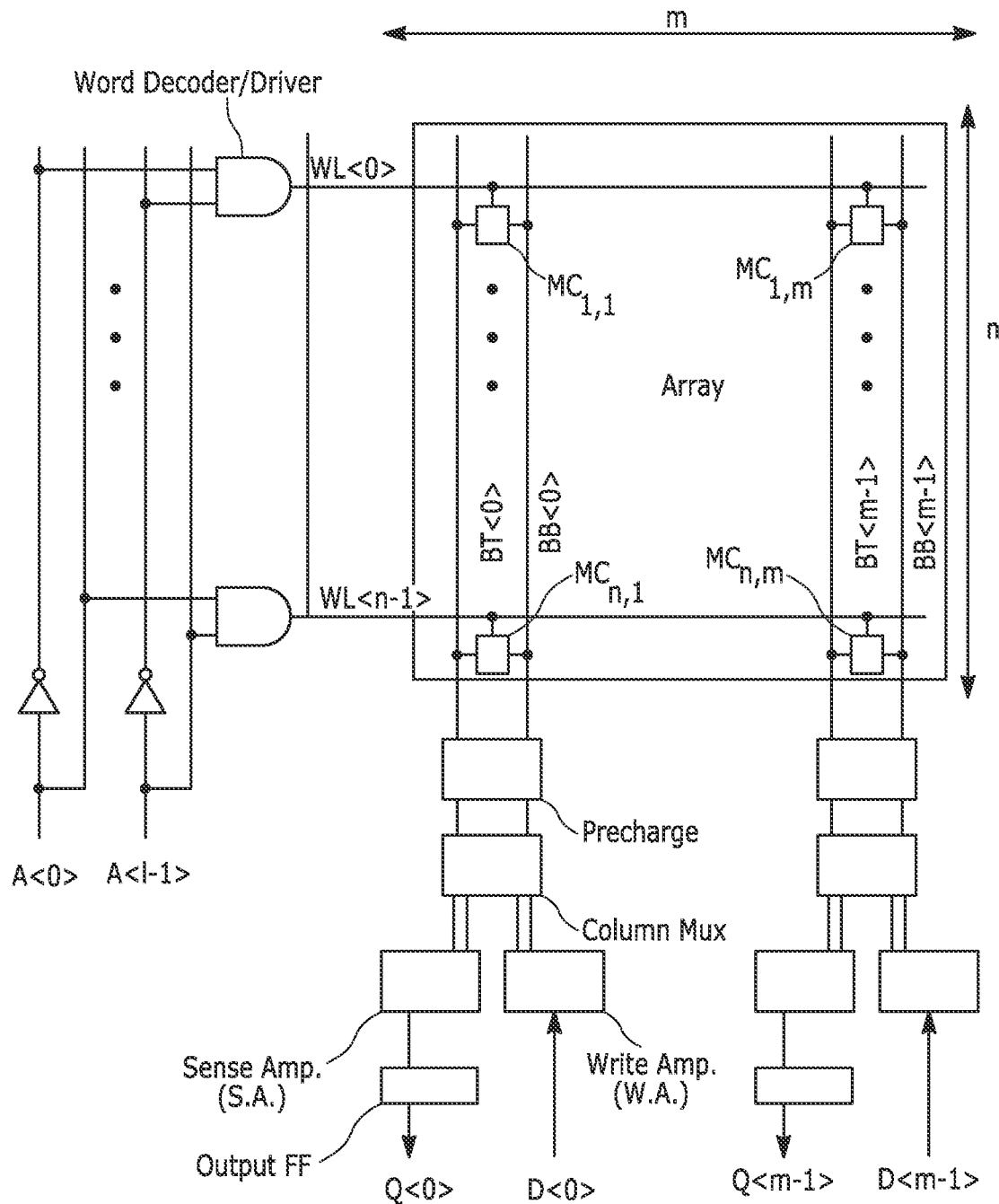
FIG. 1a shows a SRAM cell array according to the prior art.
Figure 1B:
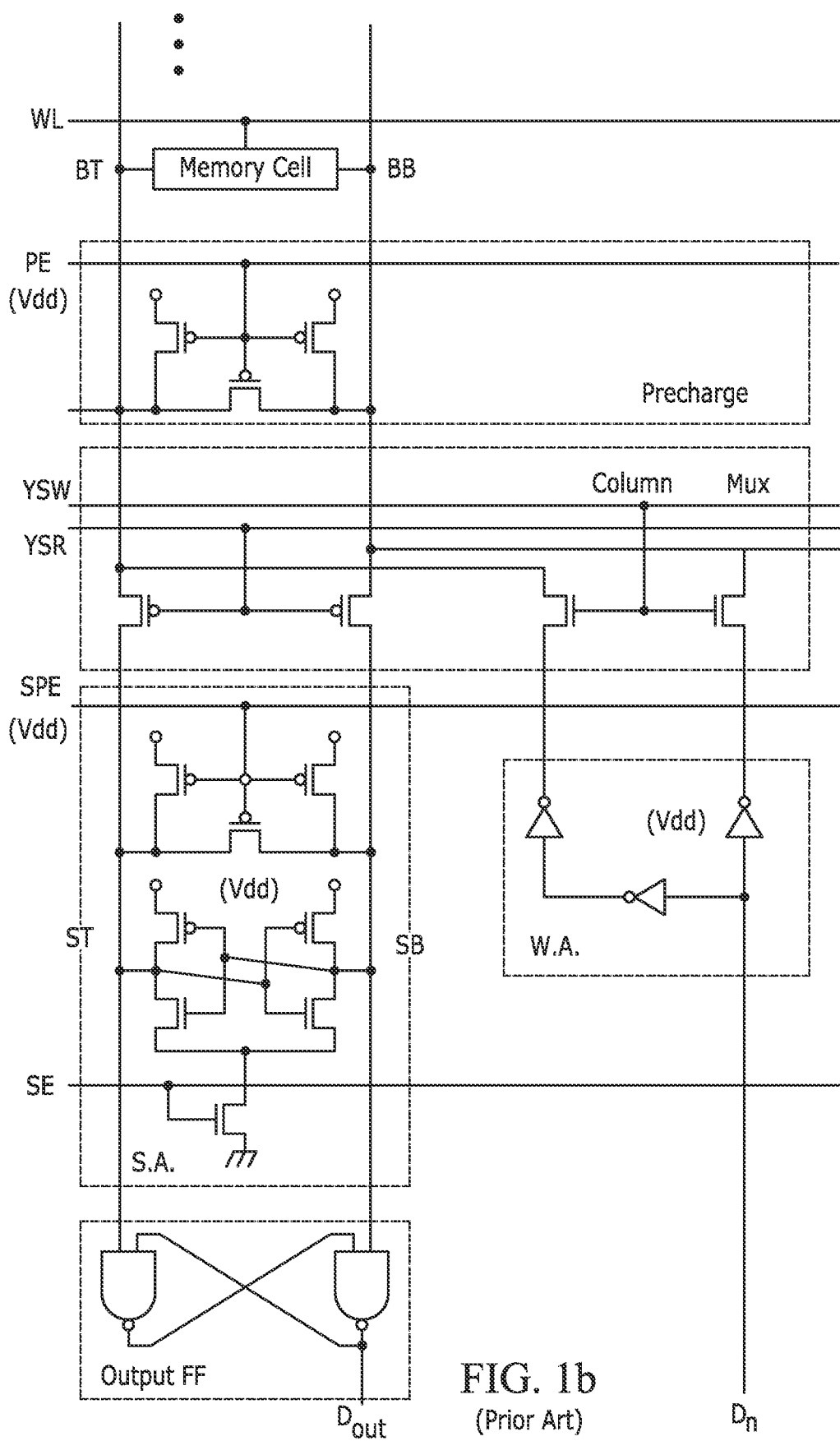

A conventional SRAM cell array is shown in FIG. 1a, comprising a plurality of SRAM cells $MC_{1,1} \ldots MC_{1,m} \ldots MC_{n,1} \ldots MC_{n,m}$, to which binary data is read/written on BLs BT<0>/VV<0> . . . BT<m1>/BB<m−1> via column precharge, multiplexers (column mux), and sense/write amplifiers (sense amp (S.A.), write amp (W.A.)), in response to read/write signals on word lines WL<0> . . . WL<n−1>. The structures of the conventional column precharge multiplexer and sense/write amplifiers are depicted in FIG. 1b.

The structure of a traditional folded-BL six-transistor MC (6T SRAM) is shown in FIG. 2a, and FIG. 2b depicts timing of the WL and BL operating signals. The 6T SRAM of FIG. 2a comprises a first inverter and a second inverter configured as two symmetric CMOS inverters forming a flip-flop. The first inverter and second inverter are configured to operate at a power supply voltage (Vdd). A first n-channel transistor has a gate for receiving the word line (WL) signal and in response connecting a first output of the first inverter to a the first bitline (BL) of the bitline pair. A second n-channel transistor has a gate for receiving the word line (WL) signal and in response connecting a second output of the second inverter to the a second bitline (BLB) of the bitline pair.

As discussed above, the conventional 6T SRAM of FIG. 2a uses a full-Vdd bitline (BL) precharge scheme (F-BP) and non-boosted WL pulse ($V_{WL}$=Vdd), with data written/read via complementary bit lines BL and BLB. However, such 6T SRAMs suffer from problems regarding the BL-power and the read/write signal margins due to the BL-power being derived from a large BL-swing of Vdd.

Also as discussed above, a Vdd/2 bitline precharge scheme (H-BP) has been used with the unique 5T-SRAM memory disclosed in K. Itoh et al, where the 5T-SRAM memory is shown in FIG. 3a, the H-BP circuit is shown in FIG. 3b and FIG. 3c depicts timing of the WL and BL operating signals, and wherein Vdd=0.45V, $V_{DH}$=Vdd+ δ=0.75V, $-V_{SL}$=−δ=−0.3V and $V_{ref}$=Vdd/2.

As further discussed above, application of the H-BP approach to a conventional 6T SRAM results in poor noise margin when reading the memory cell, which leads to unstable read operations because precharging the BLs to Vdd/2 during the read cycle increases the possibility of an erroneous flip of data.

Figure 5:
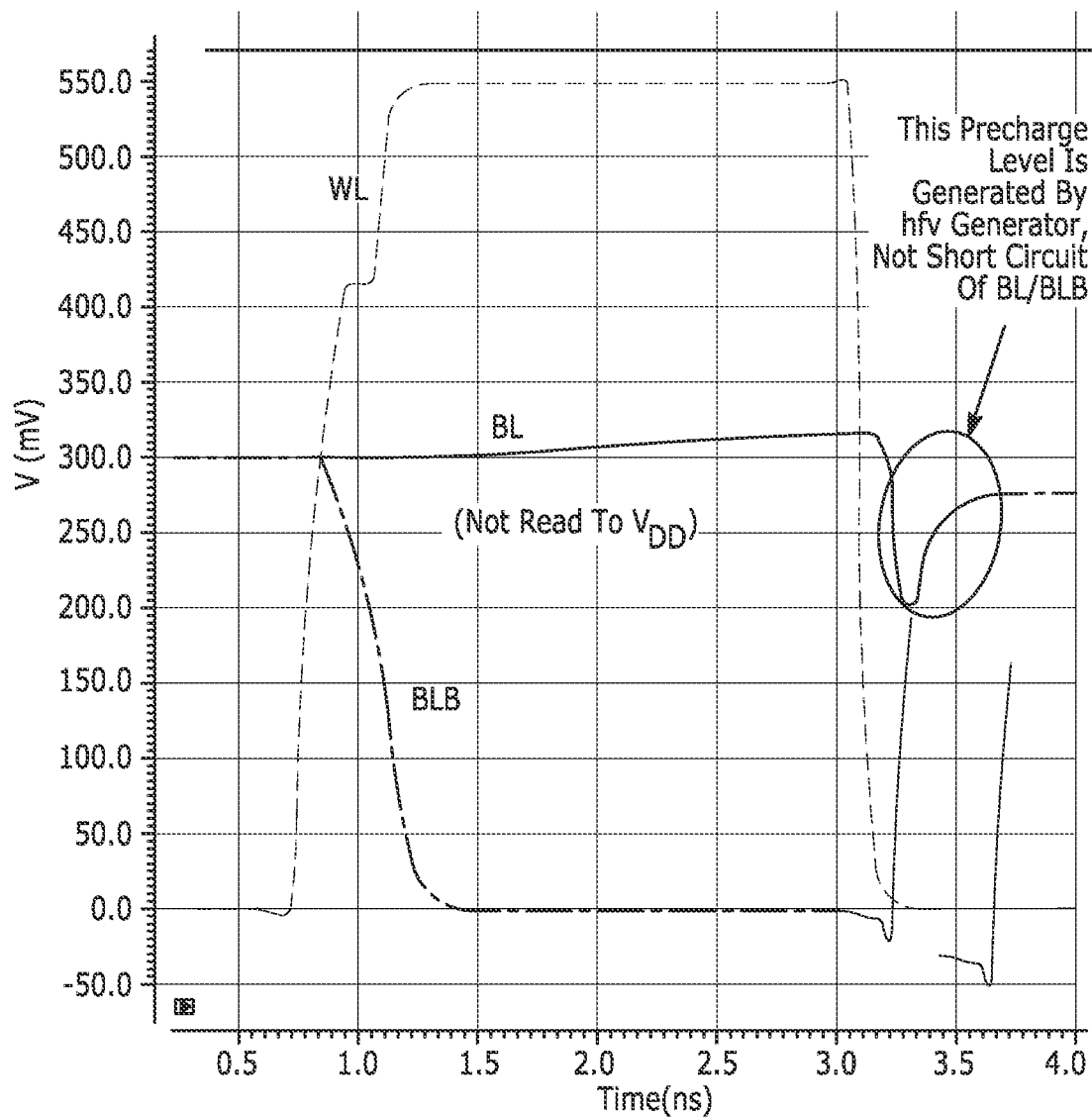
FIG. 5 shows WL, BL and BLB signals for the 6T SRAM MC of FIG. 2a using Vdd/2 bitline precharge in the absence of a BL amplification.

Furthermore, if a bitline precharge circuit is provided for a 6T SRAM MC as shown in FIG. 2a, for precharging one bitline (BL) from Vdd/2 to Vdd during data read operations, if Vdd is reduced for the purpose of lower power dissipation, the PMOS transistors are unable to charge BL from Vdd/2 to Vdd, as shown in FIG. 5. A conventional amplifier circuit can be provided to amplify BL from Vdd/2 to Vdd, as described in Teman, "Digital Integrated Circuits; Lecture 8: Memory Peripherals," p. 32, Emerging Nanoscaled Integrated Circuits and Systems Labs, Bar-Ilan University, 20 May 2017. However, such a circuit suffers from the problem that the BL length is longer and the area of the conventional amp is too large to be placed in every column pitch, and in fact occupies two column pitches so that the amplifier must be placed in two stacks for every two columns thereby lengthening the BL and thereby increasing the BL charge-up power and the response time of the amplifier. Also, every column requires two column switches each of which includes two transistors, which further increases the device area. As discussed below with reference to FIG. 15a, a solution is set forth below using a cross-coupled PMOS structure.

An additional problem with the 6T SRAM MC shown in FIG. 2a occurs when writing a "0" (inputting a low data of 0 V to N1 of the MC). The difficulty results from a low conductance due to the non-boosted WL-pulse. Two solutions have been proposed to address this problem. One is simply to boost the WL-pulse during write, $V_{WW}$, to a level higher than Vdd. The other is a so-called negative BL scheme (NBL), as discussed in .H. Chen et al., "A 16 nm 128 Mb SRAM in High-Metal-Gate FinFET Technology with Write-Assist Circuitry for Low-VMIN Applications", IEEE Journal of Solid-State Circuits, Vol. 50, No. 1, January 2015, which provides a negative low voltage (−δ≅−0.2 to −0.3V) to the BL under non-boosted WL write voltage, so that the resultant lowered gate voltage enables flipping of the previously stored data. The NBL scheme dissipates the BL-power at write, due to an increased BL-voltage swing from Vdd to (Vdd+δ). For traditional SRAMs, a combination of NBL and non-boosted WL pulse have become a de-facto standard because the BL-power during write operations from a small number of MCs is small. However, this combination is ineffective for emerging SRAMs due to an intolerably high power from the larger number of MCs (note that even a small δ of NBL directly increases the total BL-power during write operations.

Figures 6A, 6B:
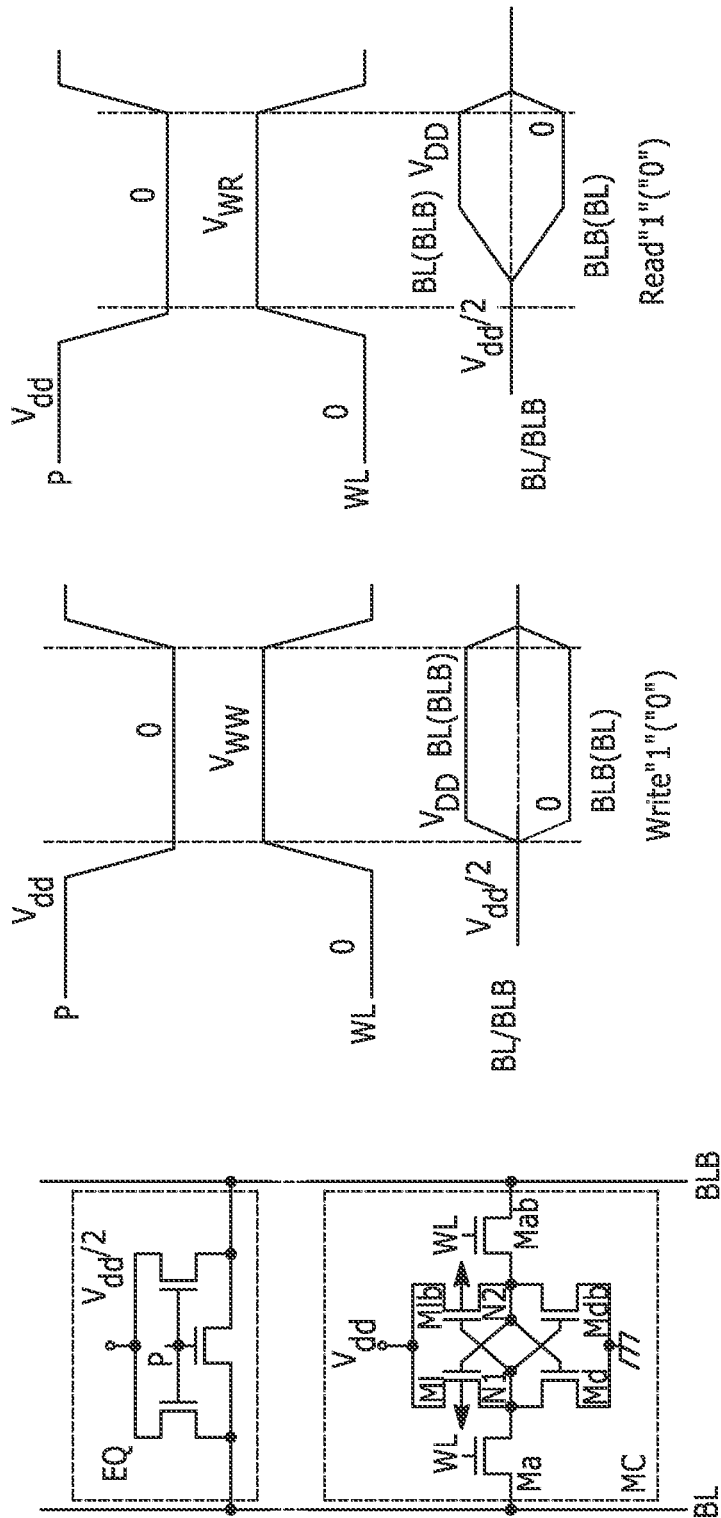
FIG. 6a shows a half-Vdd BL (bit-line) precharge (H-BP) circuit for a 6T SRAM, according to an embodiment.
FIG. 6b depicts timing of the WL and BL operating signals therefor.
Figure 6C:
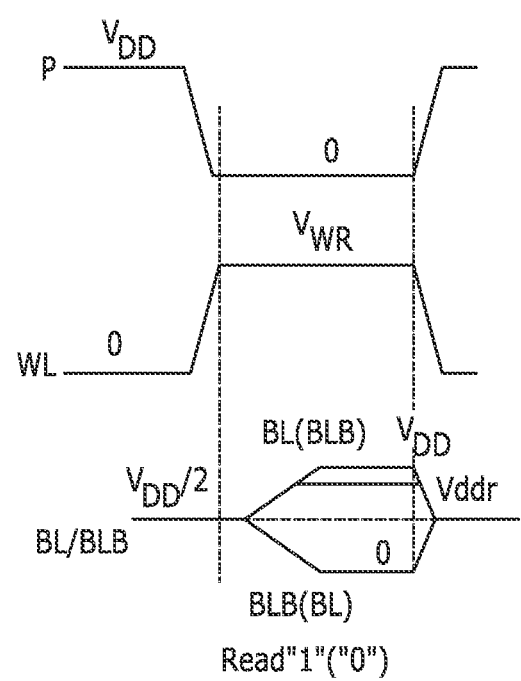
FIG. 6c depicts timing of the WL and BL operating signals with the BL high level of FIG. 6b reduced from Vdd to Vddr.

In the following, a H-BP circuit is described for low-power simple 6T-SRAMs. Next, the voltage margin of MC is investigated, focusing on read and write operations, in terms of the voltage of the WL-pulse since even if the write margin can be ensured by simply boosting $V_{WL}$, the read margin is a more complex problem related to the amplitude of WL-pulse. Finally, combinations of $V_{WR}$ and $V_{WW}$ are explored for both traditional SRAMs and emerging SRAMs FIG. 6a shows a half-Vdd BL (bit-line) precharge (H-BP) for 6T SRAM, according to an embodiment, wherein Vdd/2 is a reference voltage ($V_{ref}$) for stored data "1" and "0", enabling a halved BL-power during read and write with halved BL-swing, as depicted in FIG. 6b. According to an additional aspect of this specification, a further low power configuration is provided for reducing the BL high level in FIG. 6b, from Vdd to Vddr, as shown in FIG. 6c, by means of a Vdd generator discussed in greater detail below with reference to FIG. 14a.

Figure 4:
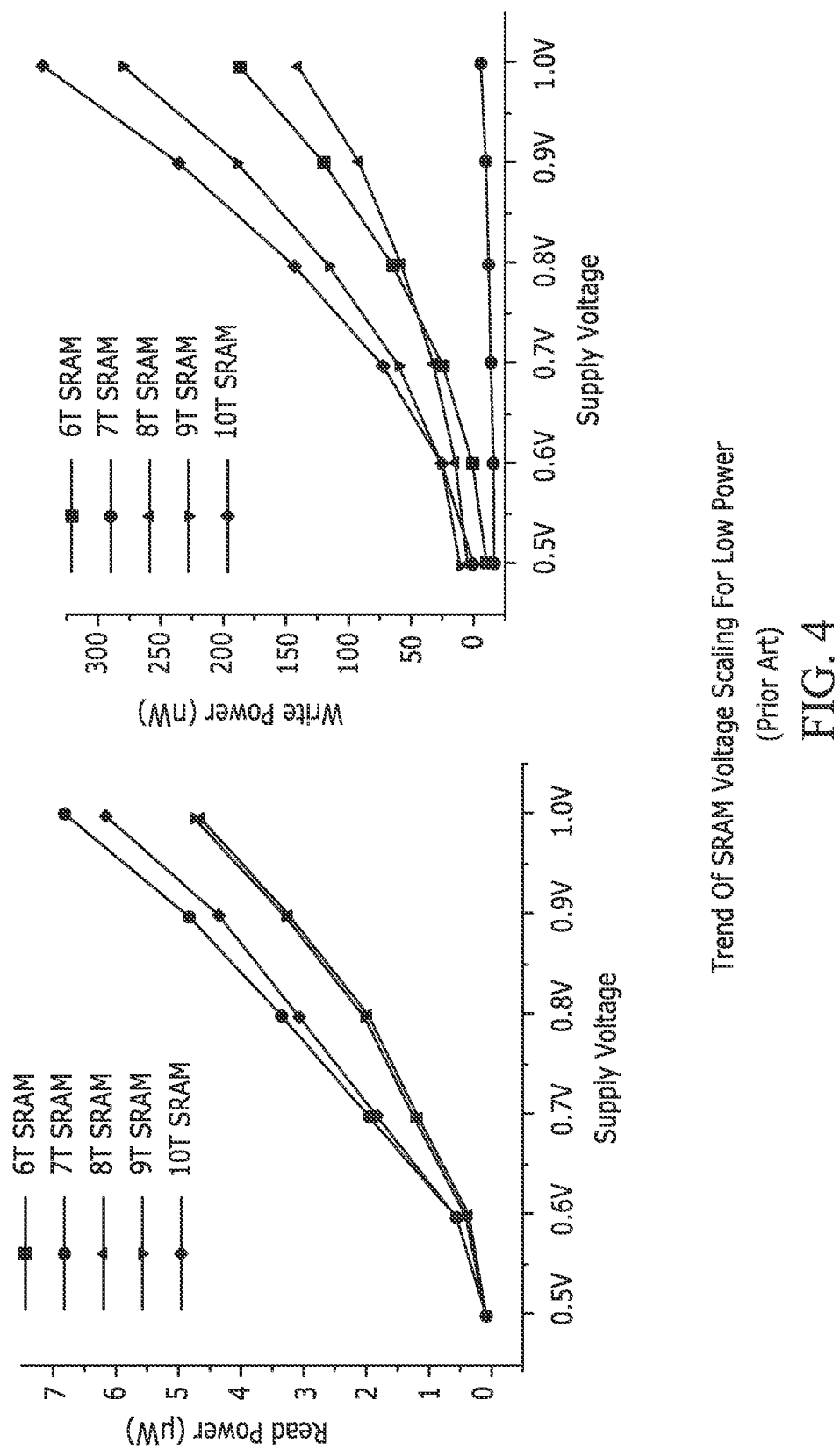
FIG. 4 shows graphs of read/write power trends of SRAM voltage scaling for low power, according to the prior art.

To answer the demand for low power, the SRAM supply voltage can, in some embodiments, be decreased toward 0.5V, as shown in FIG. 4. On the other hand, SRAM bit cell SNM (Static Noise Margin) decreases as supply voltage is decreased. Moreover, the SNM of half Vdd BL precharge is lower than that of full Vdd BL precharge, which is a reason why half Vdd BL precharge has not been used in 6T SRAM, as discussed in Kanda et al., referred to above.

Figure 7A:
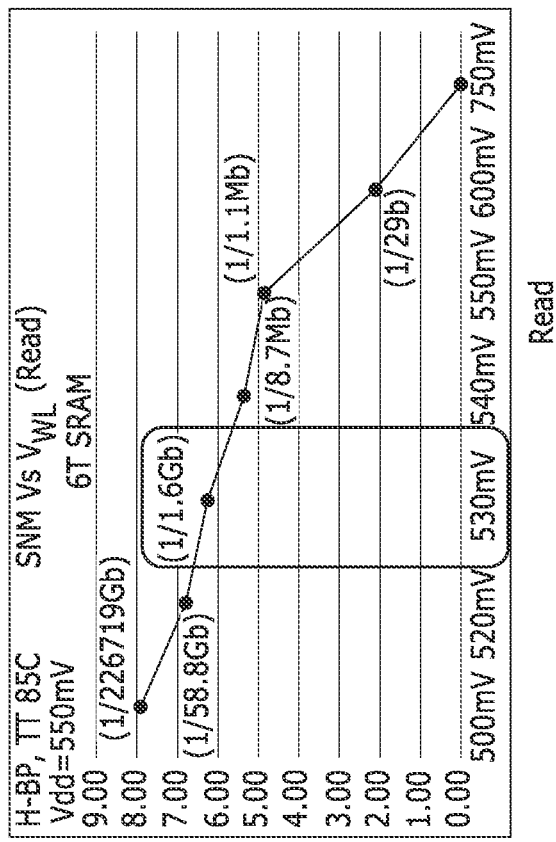
FIGS. 7a and 7b are graphs showing dependency of SNM on word-line voltage ($V_{WL}$) for a 6T SRAM with a low power supply, according to the prior art, where
Figure 7B:
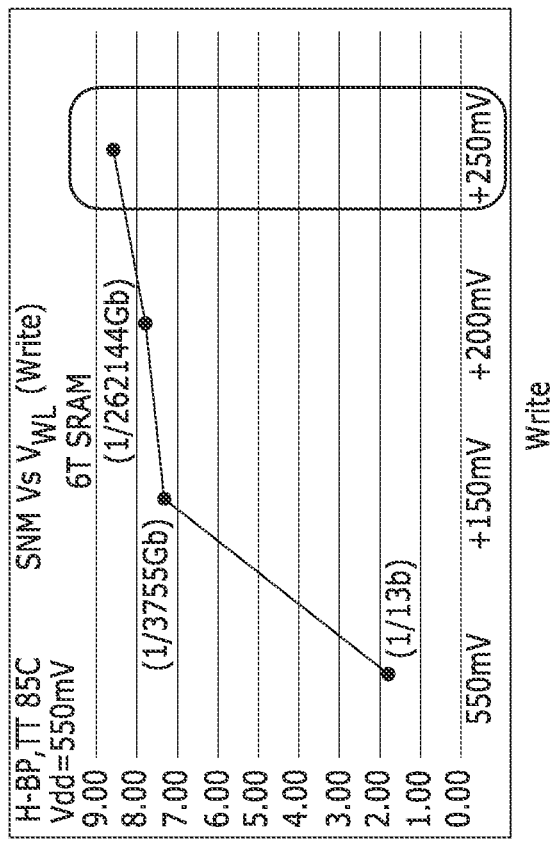

Considering the dependency of SNM on word-line voltage ($V_{WL}$) for 6T SRAM with a low power supply, as shown in FIG. 7, for a supply voltage, Vdd, =550 mV, it will be seen that a read operation is possible, but $V_{WL}$ (write) is required to be more than Vdd+150 mV where a negative BL voltage (NVBL) is not used for write-assist because of low power dissipation. Therefore, according to an aspect of this specification, it is proposed that the word line (WL) voltage be different for read and write operations—that is, $V_{WL}$ (read)=Vdd and $V_{WL}$(write) can be boosted above Vdd in the H-BP architecture for 6T SRAM.

Figure 8A:
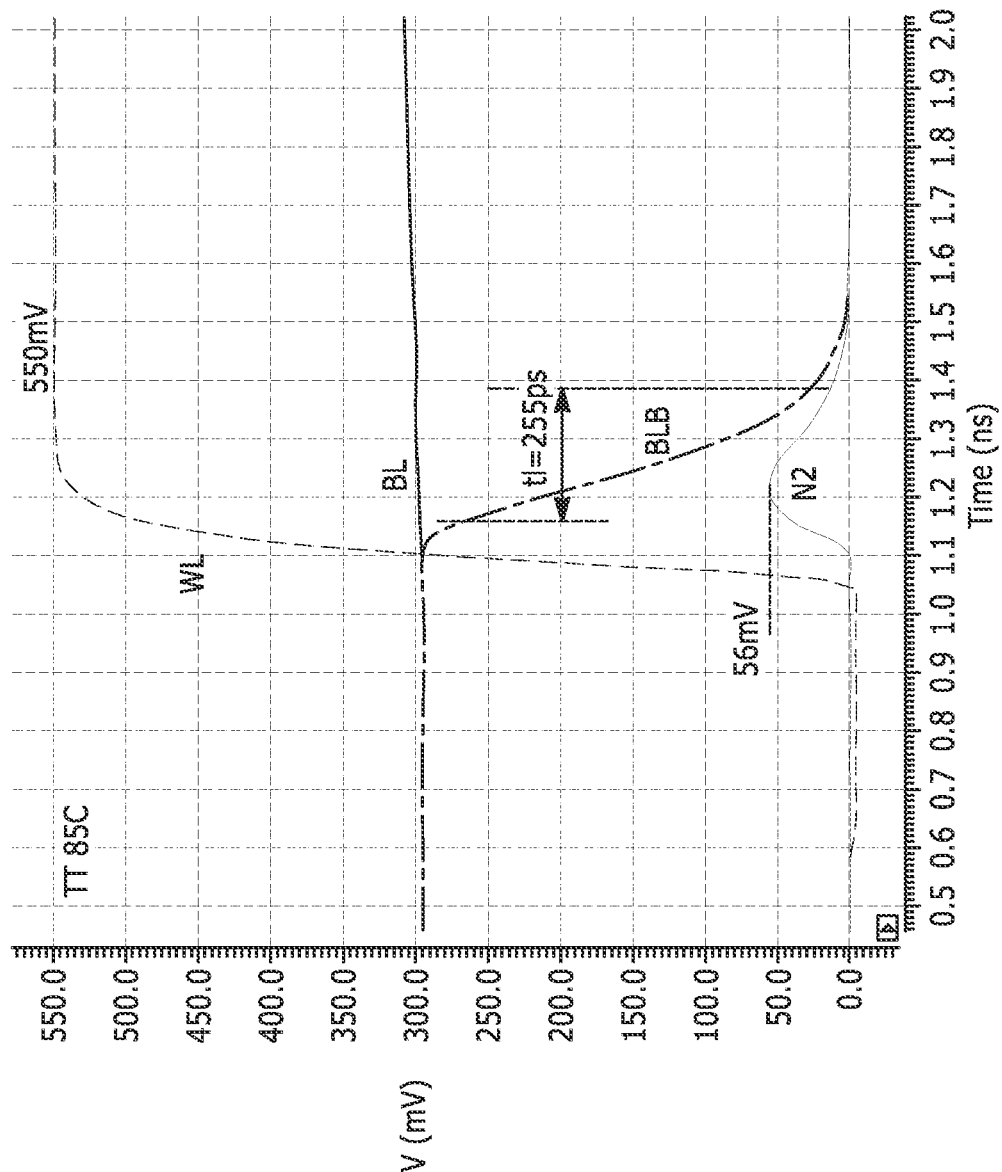
FIGS. 8a, 8b and 8c are graphs showing BLB, N2 peak and N1 dip dependency on $V_{WL}$ during a read operation, for the prior art folded-BL six-transistor MC (6T SRAM), of FIG. 2a, where
Figure 8B:
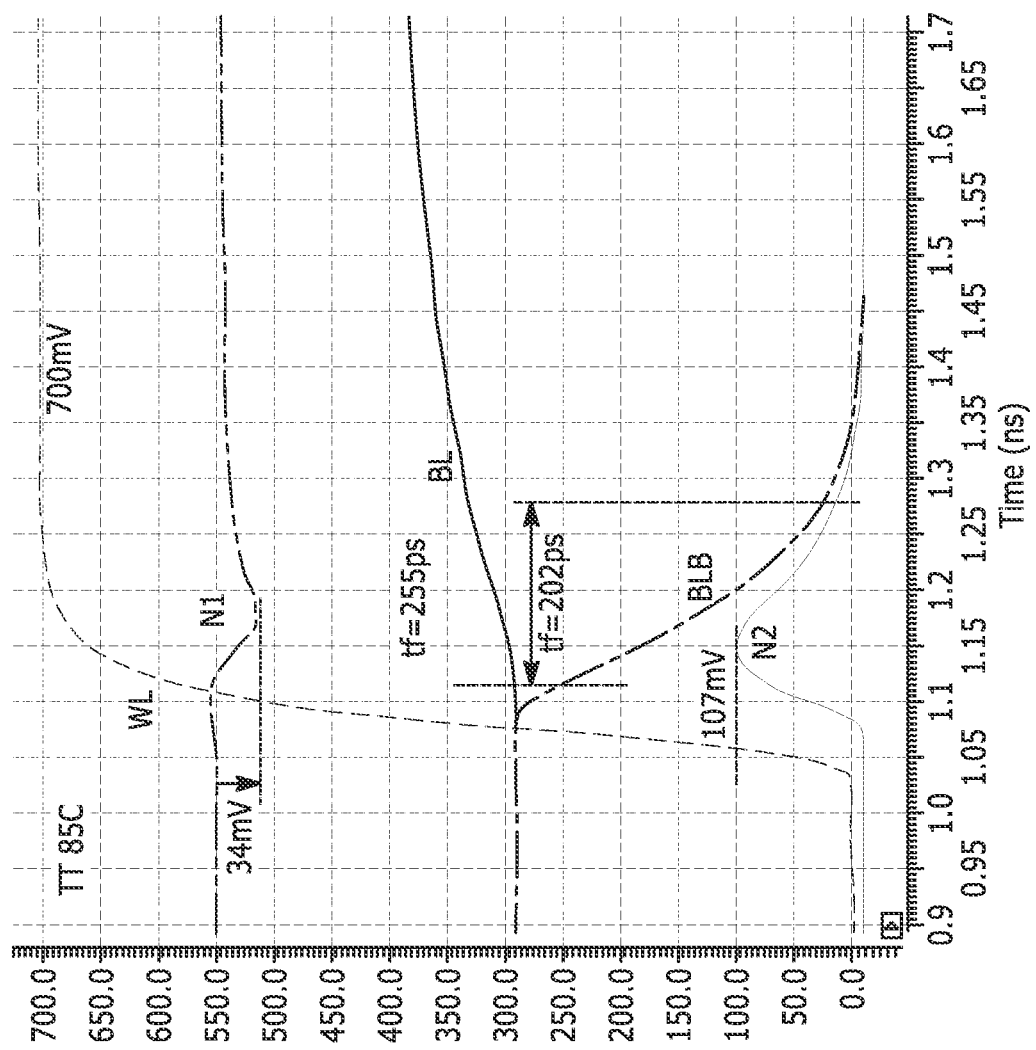
Figure 8C:
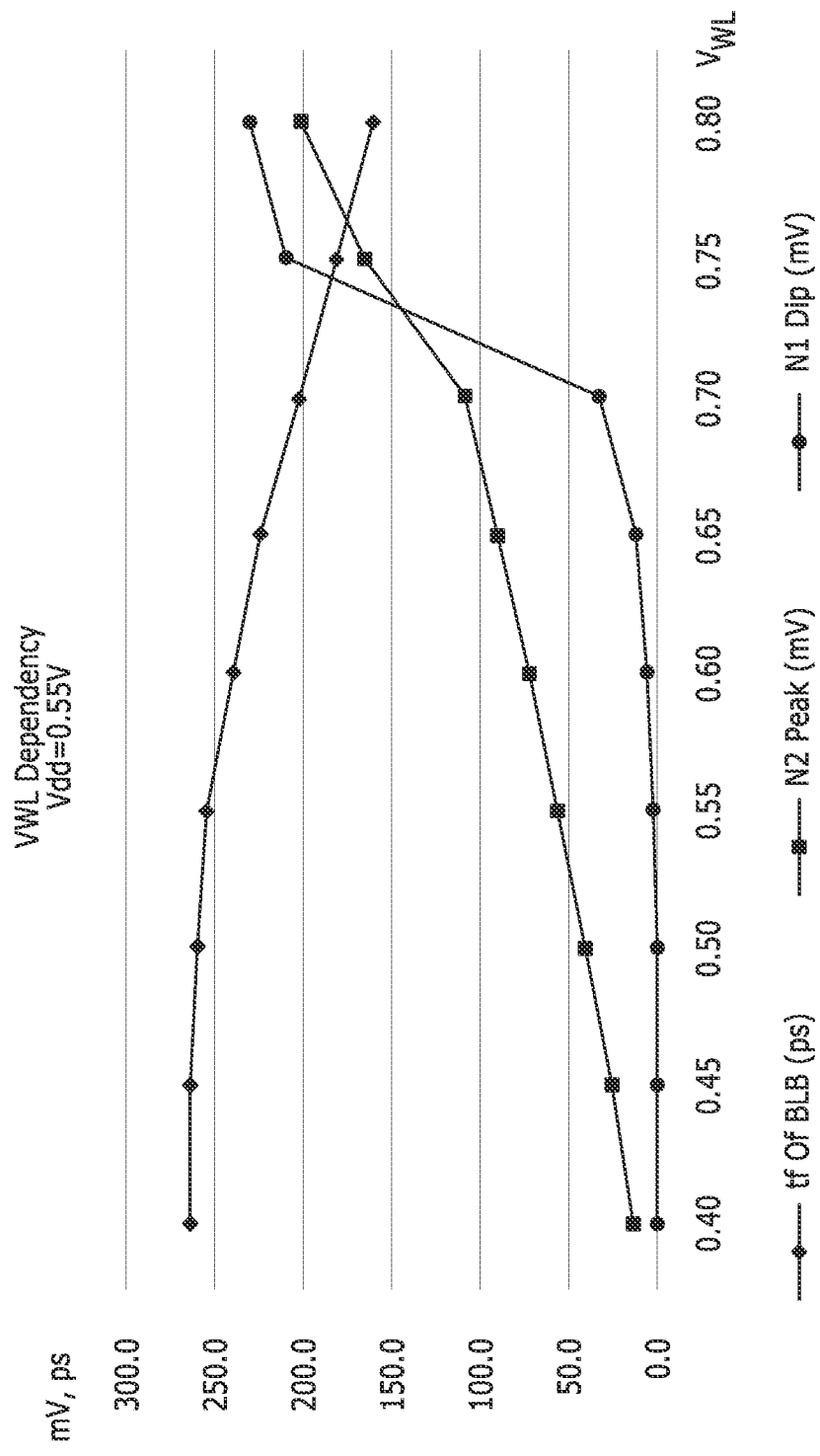

Furthermore, when an application of 6T SRAM requires further robust reliability such as for a server or automobile application, $V_{WL}$ should be set to 500 mV for read operations, providing about 8 sigma or 1b failure per 226719 Gb, which is a reliability level generally equivalent to full-Vdd BL precharge at 700 mV, from FIG. 4. The read SNM improves with lower $V_{WL}$, however a lower $V_{WL}$ makes the BLB discharge speed slower, as shown in FIGS. 8a-c for the traditional folded-BL six-transistor MC (6T SRAM) of FIG. 2a.

Figure 9A:
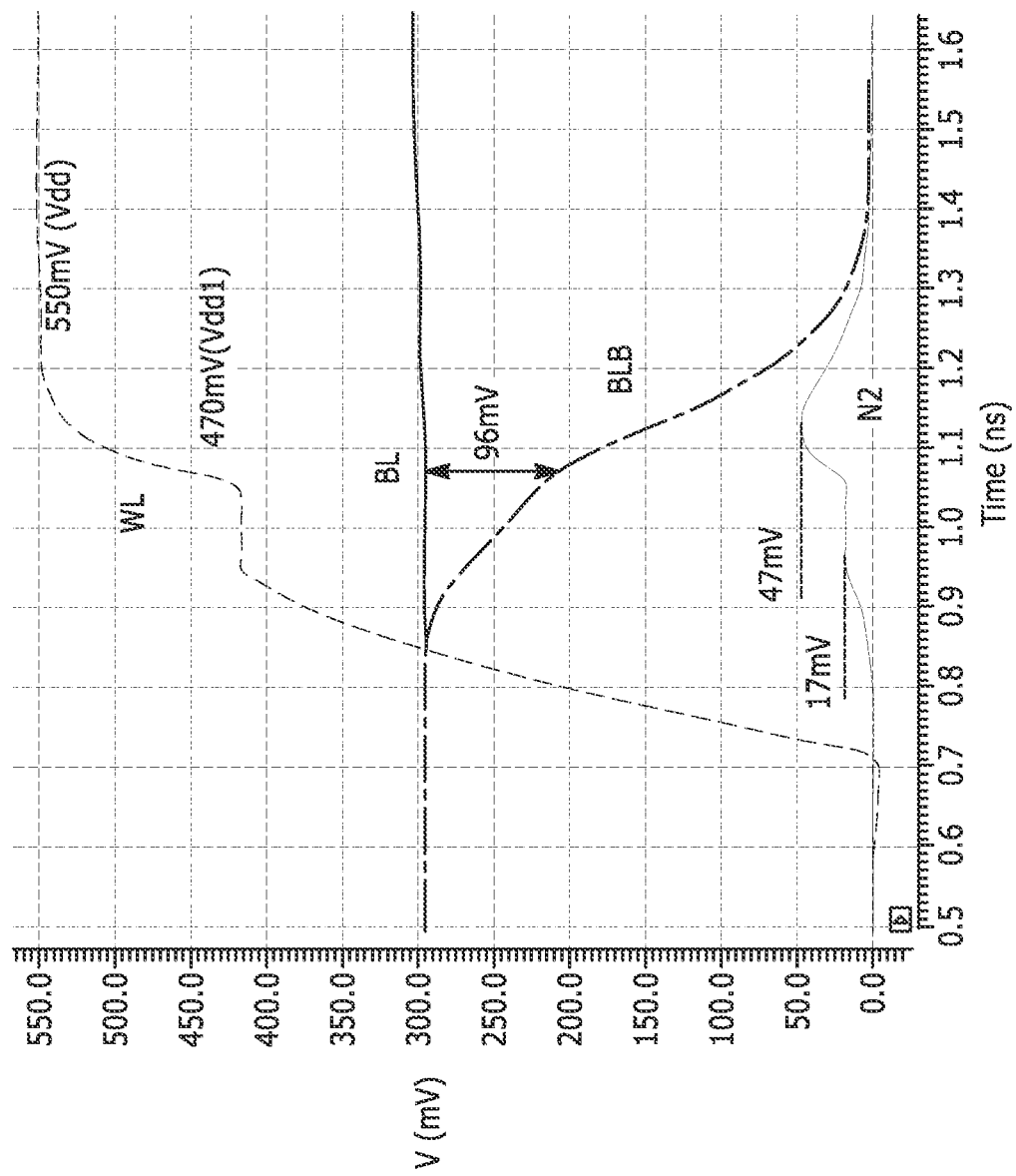
FIG. 9a and FIG. 9b show a two-step word line for the half-Vdd BL precharge circuit of 6T SRAM of FIG. 6a, where

Therefore, according to an embodiment, a two-step word line is provided for half-Vdd BL precharge of 6T SRAM of FIG. 6a, as shown in FIG. 9a. The first step of the WL wave shape is driven by Vdd1 which is less than Vdd and larger than Vdd/2. The purpose of the first step is to minimize RSNM (Read Static Noise Margin) or to reduce the N2 transistor peak and the N1 transistor dip, while second step at Vdd speeds up BLB discharge. According to FIG. 9a where Vdd1 is set to 470 mV, the first WL step amplifies BL and BLB to 96 mV and reduces the N2 peak to just 17 mV. Once BL and BLB split by 96 mV, there is no RSNM concern because 96 mV is large enough to compensate for RSNM, so that the second WL step which is driven by Vdd (e.g. 550 mV) can be applied to speed up the BLB discharge.

Figure 9B:
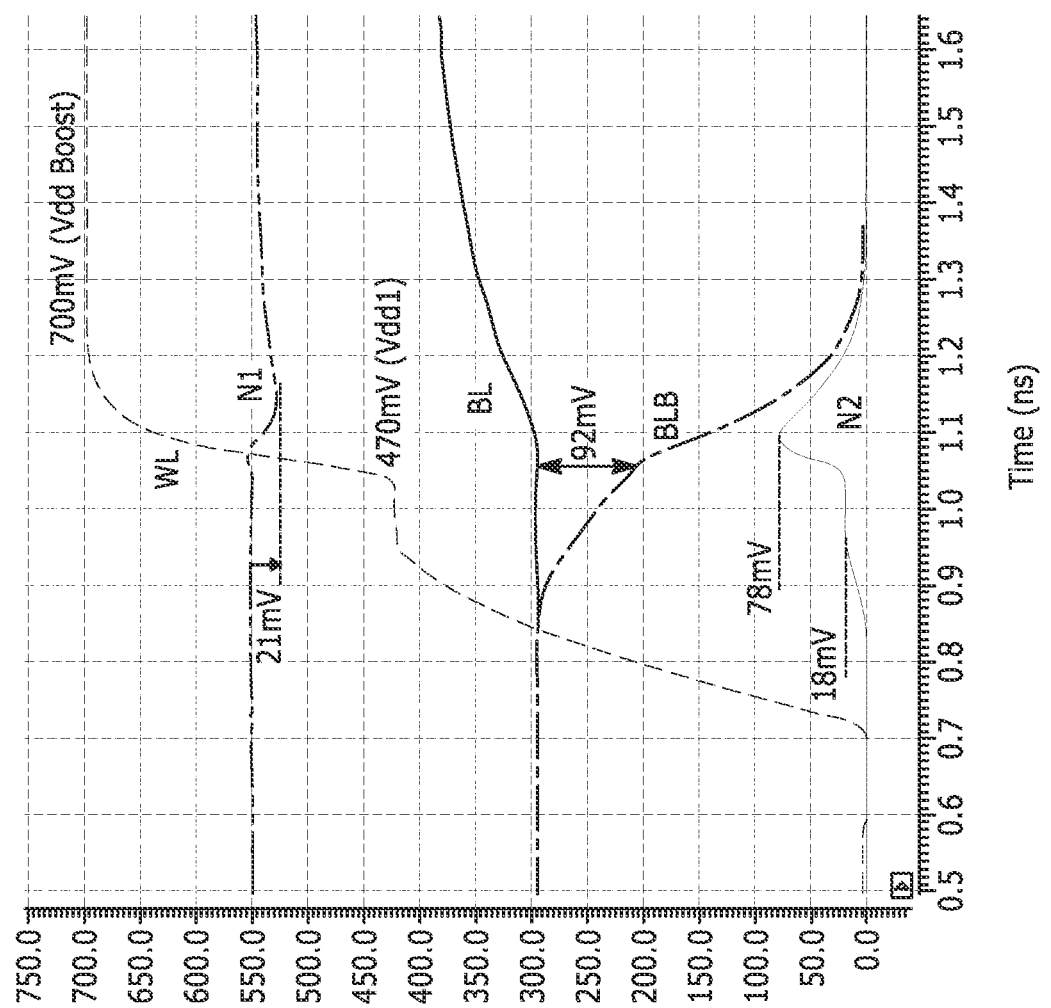

In write mode, a word line boost is needed, as shown in FIG. 9b. Write assist circuits are known in the industry: negative BL voltage (NVBL) write, cell Vdd dip during write, and WL boost. NVBL consumes more power than cell Vdd dip during write or WL boost because NVBL needs significant drive to swing BL due to capacitive load, but also to flip the bit cell data. Cell Vdd dip in write and WL boost circuits requires drive capacitive load only. Cell Vdd dip circuits generally sacrifice the margin of cell data retention. For this reason, WL boost is preferred. In the case of a write mask function or selective column write, several bits are written and several bits are not written, but read only, which are referred to as half-select MCs, as discussed above, on the same word line. This means that even in write mode, several bits are read only, so that WL boost cannot be applied directly.

Therefore, as shown in FIG. 9b, the first WL step in write mode is the same as the first step for a read operation, and the second WL step is Vdd for read, and is boosted for write. It can be seen that the first WL step splits BL and BLB to 92 mV, which leads to a successful read without any RSNM issues because the 92 mV split provides enough signal to compensate for RSNM.

Figure 10A:
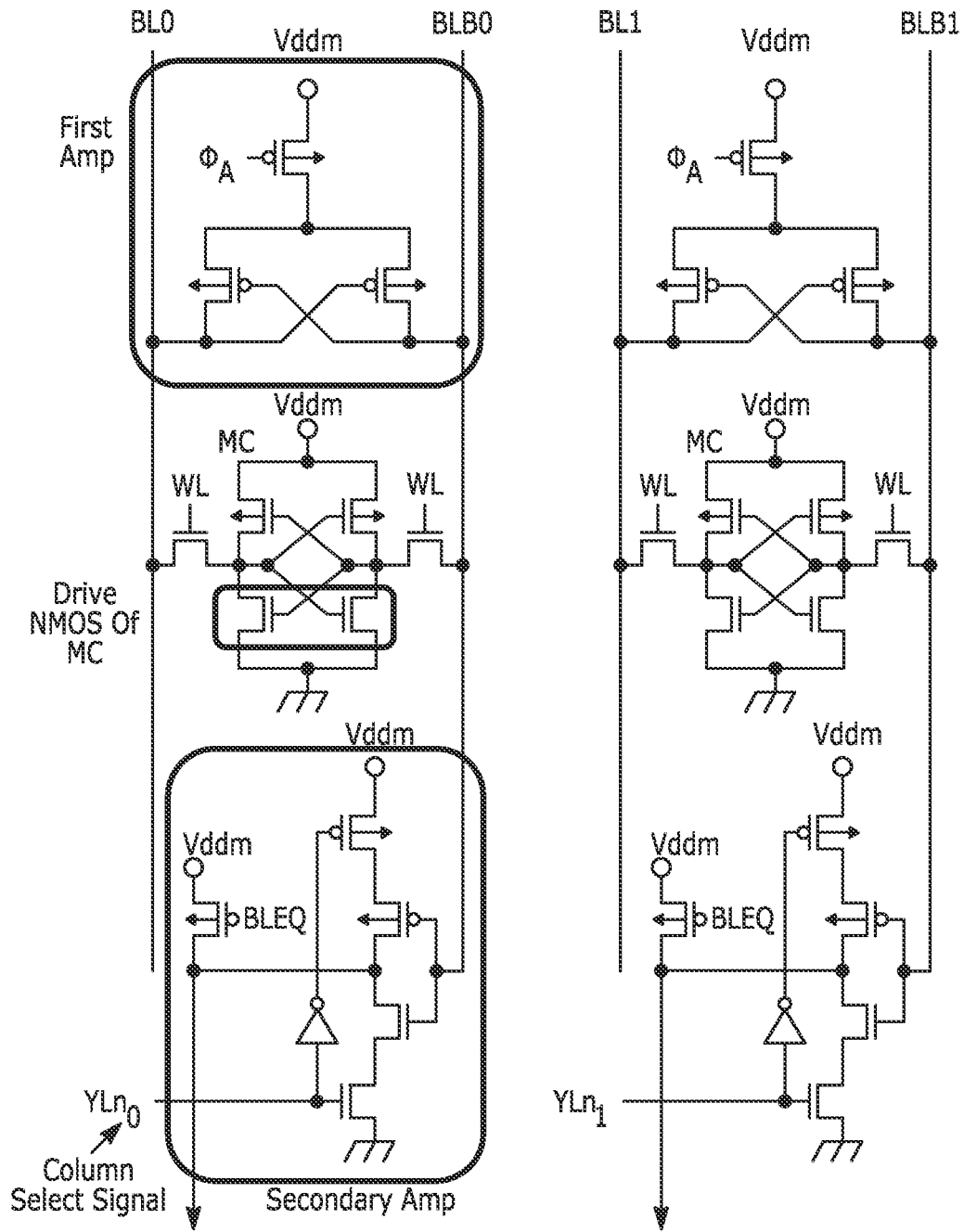
FIG. 10a shows a BL amplifier adapted for low voltage operation, according to an embodiment.
Figure 11:
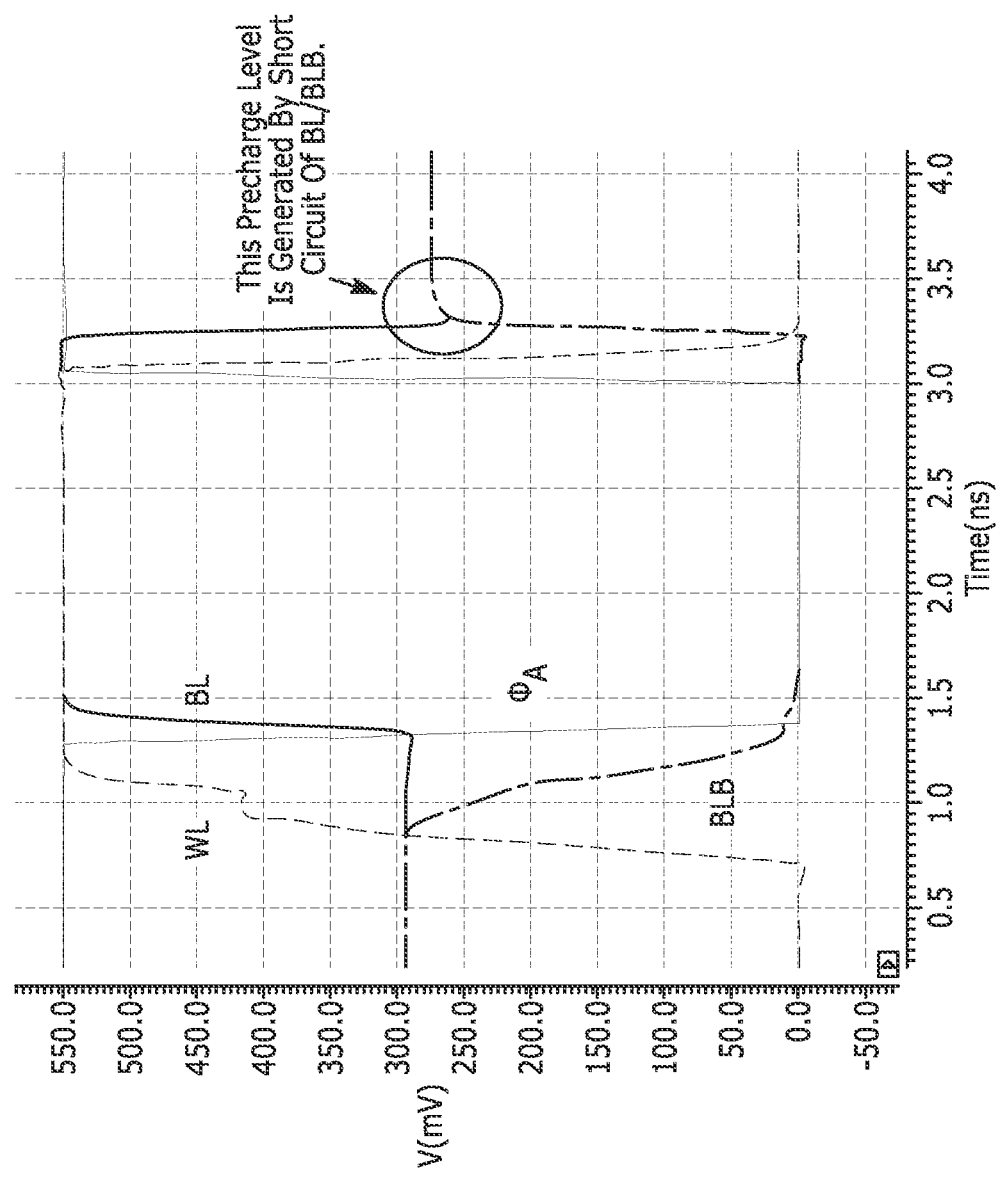
FIG. 11 shows the BL waveforms generated with the BL amplifier of FIG. 10a or FIG. 10b.

According to a further aspect of this specification, the two-step WL is provided by a BL amplifier as shown in FIG. 10a, adapted for low voltage operation. As described in A. Teman, referred to above, a conventional amplifier suffers from performance issues relating to long BL and large area. By way of contrast, the amplifier of FIG. 10a includes two amplifiers; a first amp to amplify BL "H" and a secondary amp with column switch. The first amp includes cross-coupled PMOS and drive NMOS of the MC, and the secondary amp is in the form of a clocked inverter, for receiving a column select signal, YLn, which controls timing for activating the secondary amp and selecting the column to transfer the data to an output buffer. The amplifier of FIG. 10a has a shorter BL than the conventional amplifier, and the area is small enough to fit into every column pitch. FIG. 11 shows the BL waveforms generated with the amplifier of FIG. 10, which can be contrasted with FIG. 5.

An alternative embodiment of BL amplifier is shown in FIG. 10b, where the secondary amp is replaced by a read MUX buffer.

FIG. 12a-1 shows Vdd being used for the second step WL where Vdd1 is less than Vdd. In this Figure, two different voltage supplies, Vdd and Vdd1, are connected using two different timing signals, A and B, whose relation is shown in FIG. 12b. FIG. 12a-2 shows a circuit with a boosted voltage applied for the second WL step, which is the same concept as used in FIG. 12a-1, but the signal B' is a boosted signal to cut off the boosted voltage source, Vdd_boost.

Figure 13A:
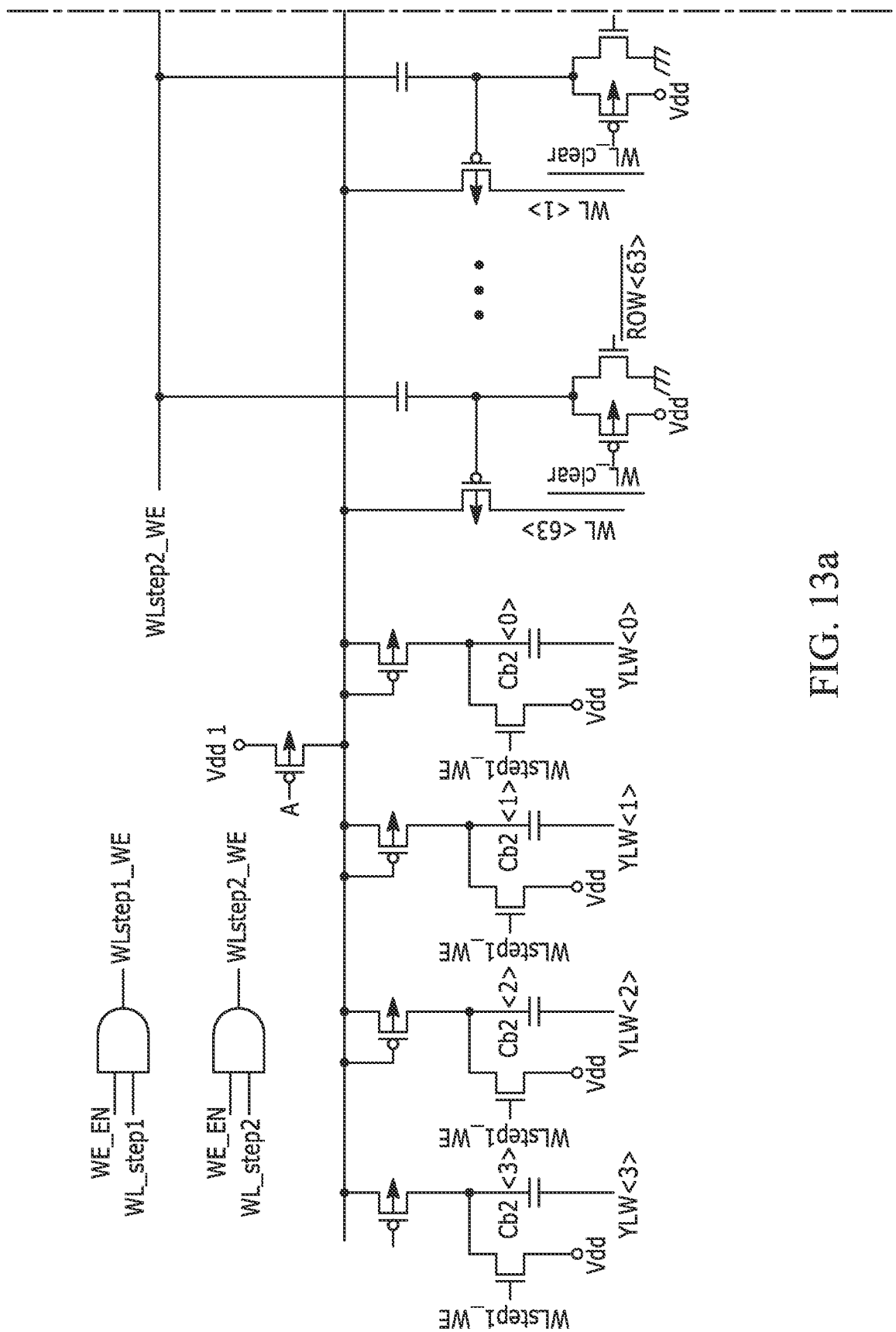
FIG. 13a shows an on-chip two-step WL boost circuit for write mode, without any external boost power supply.
Figure 13A:
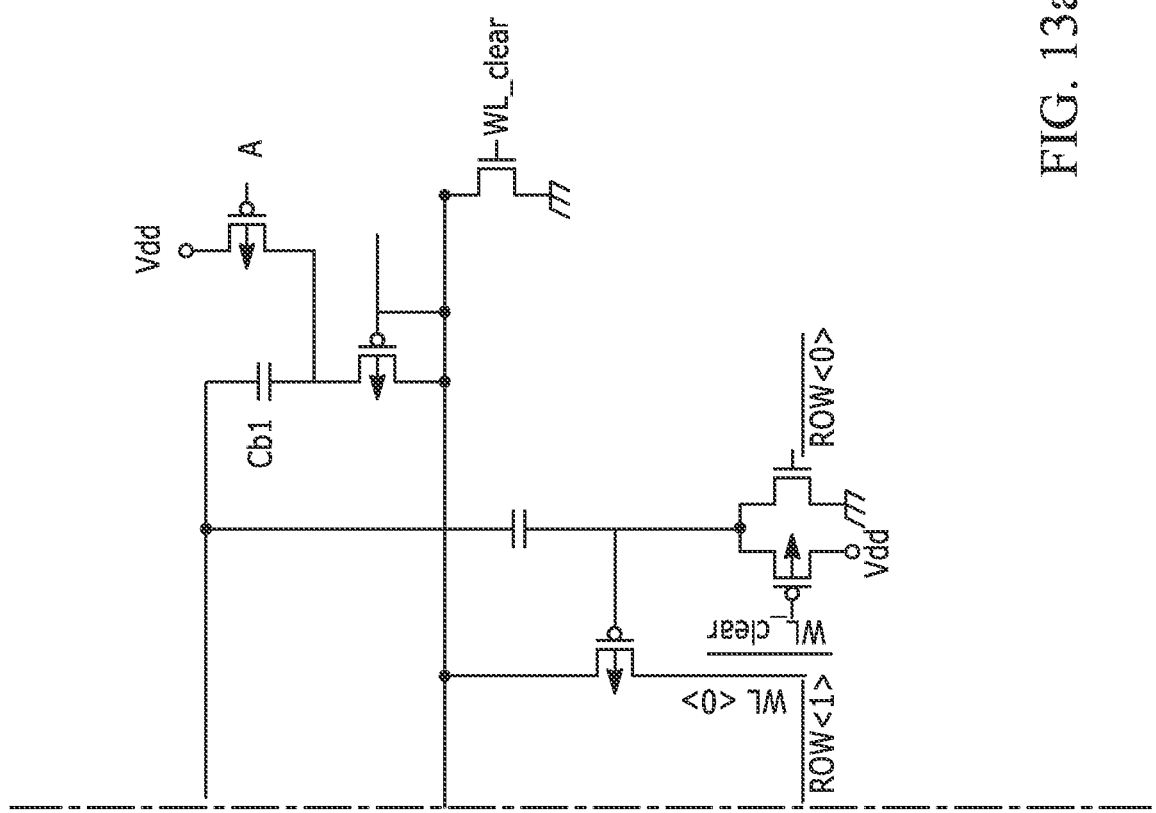
Figure 13B:
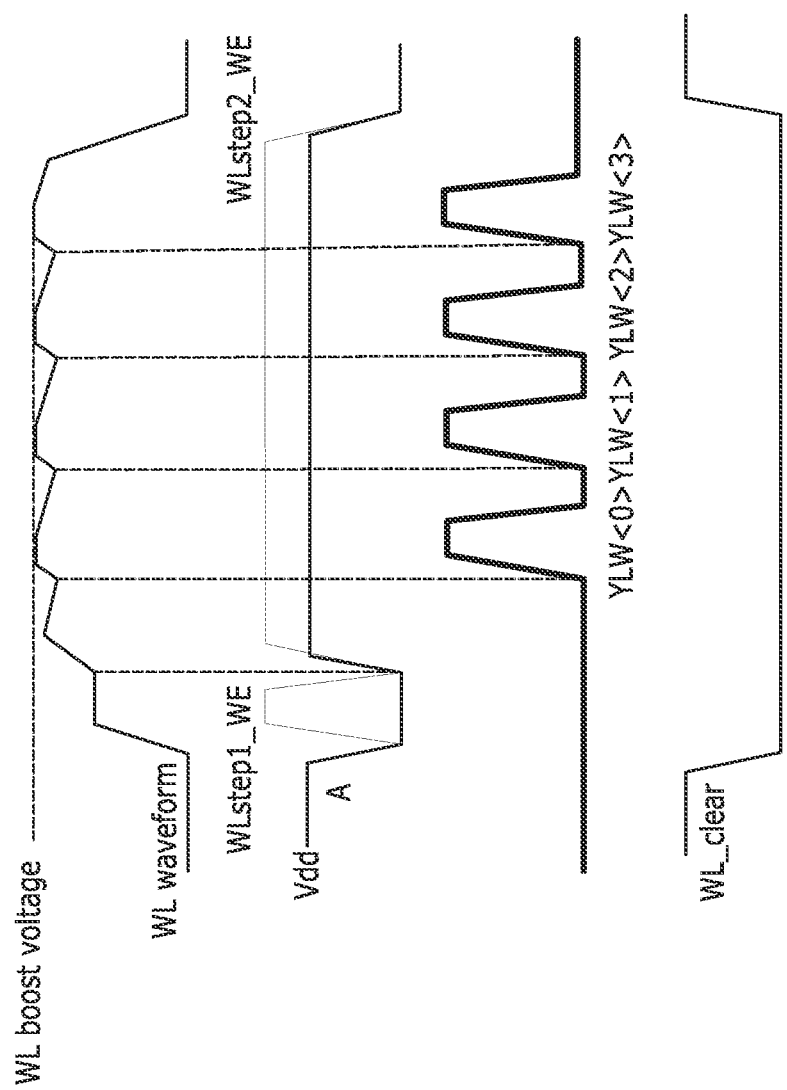
FIG. 13b is a signal timing and waveform diagram for the on-chip two-step WL boost circuit of FIG. 13a, according to an embodiment.

As shown in FIG. 13, an on-chip two-step WL generator is provided that does not require any external boost power supply. The Vdd_boost voltage, WL boost voltage, for the second WL step is generated by a one shot charge pump, rather than a ring oscillator type charge pump. The two-step WL generator of FIG. 13a comprises two parts with respect to boost circuit. At first, the first WL step, Vdd1, is provided by signal A which initiates WL turn-on. The first part of the boost circuit is a primary charge pump (Cb1) which is precharged to Vdd by the same signal, A. The second part pumps up a subsidiary capacitor (Cb2_0~3) for every write switch turn-on timing to keep WL at a boosted level during the second WL step, as shown in FIG. 13b.

Figure 14A:
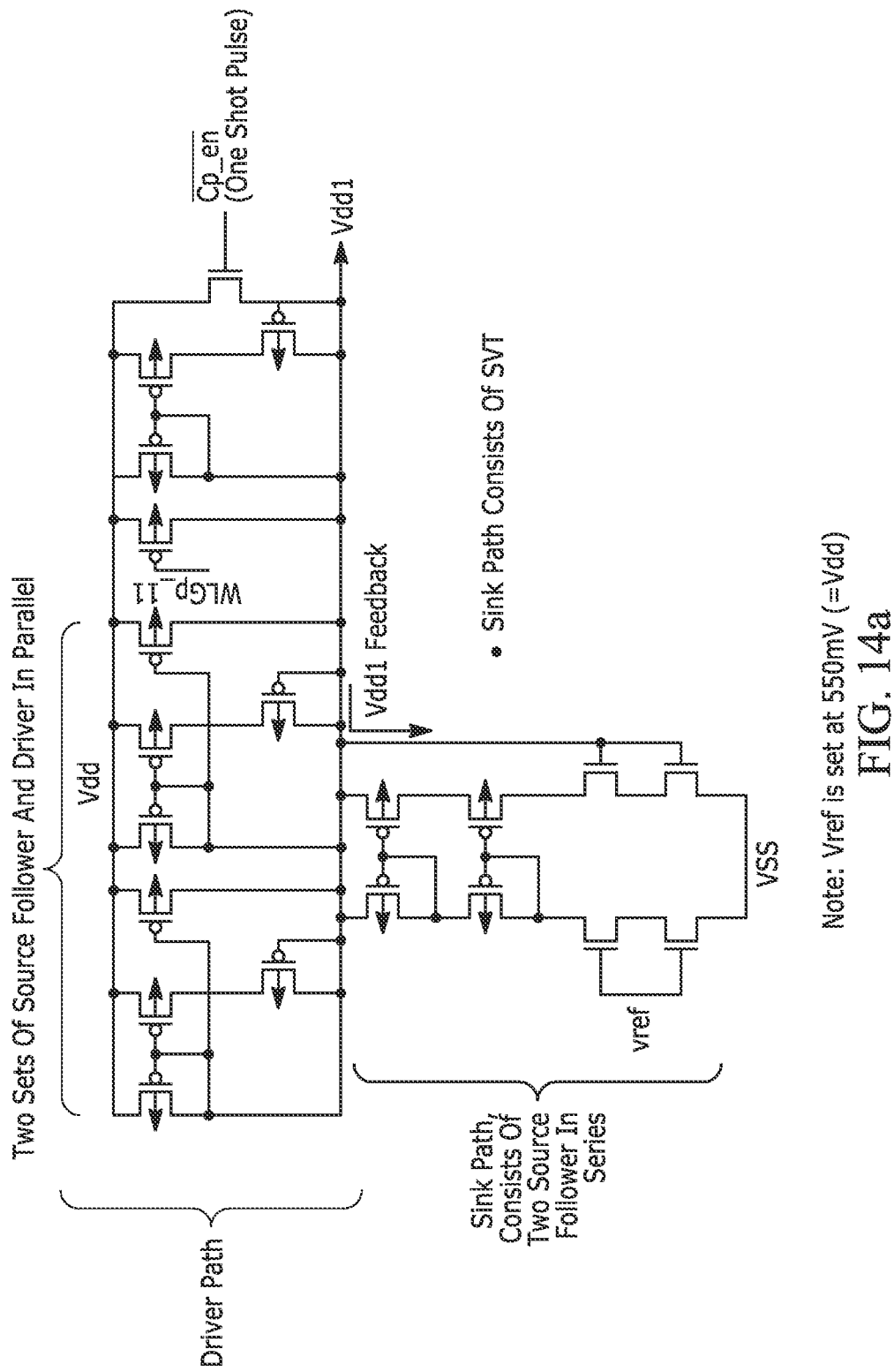
FIG. 14a shows an on-chip Vdd1 voltage generator circuit, according to an embodiment.

Although Vdd1 can be generated by an external voltage source, an on-chip Vdd1 voltage generator circuit is provided according to an embodiment, as shown in FIG. 14a. The circuit comprises two parts. The first part is a driver path having two sets of source followers and a driver connected in parallel, where the number of the parallel source followers and drivers depends on how much loading current of Vdd1 is needed. The gate voltage of the driver is determined by the source follower. The other part is a sink path comprising two source followers connected in series. The sink path maintains a stable Vdd1 voltage with low power using a feedback loop of Vdd1. The Vdd1 voltage can be adjusted by vref which is normally set to Vdd.

As discussed above, for half Vdd BL precharge, BL is charged up to Vdd from half Vdd, as shown in FIG. 6b, which is the reason why half Vdd BL precharge is lower power than full Vdd precharge. As briefly referred to above, a further low power configuration is provided according to an embodiment for reducing the BL high level in FIG. 6b, from Vdd to Vddr, as shown in FIG. 6c, by means of the Vdd generator with cross-coupled PMOS structure in FIG. 15a.

Figure 14B:
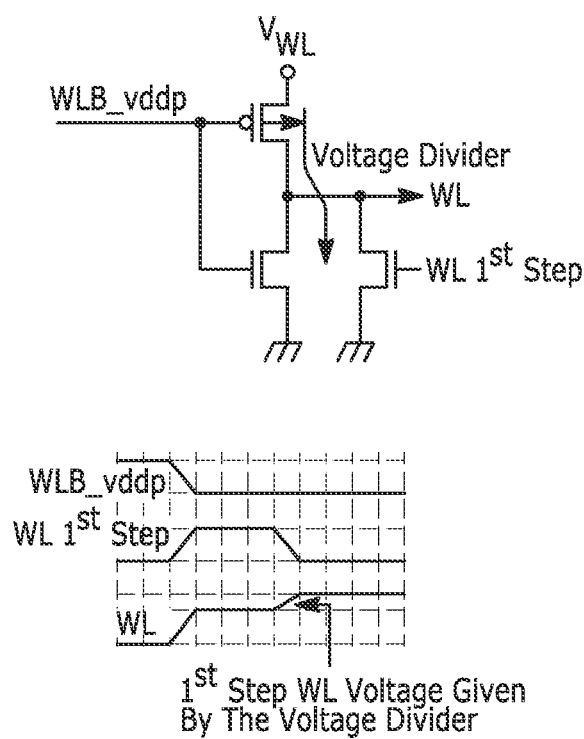
FIG. 14b shows an on-chip Vdd1 voltage divider circuit, according to an alternative embodiment.

According to another embodiment, the first power supply voltage (Vdd1) can be generated by an on-chip voltage divider as shown in FIG. 14b.

Figure 15A:
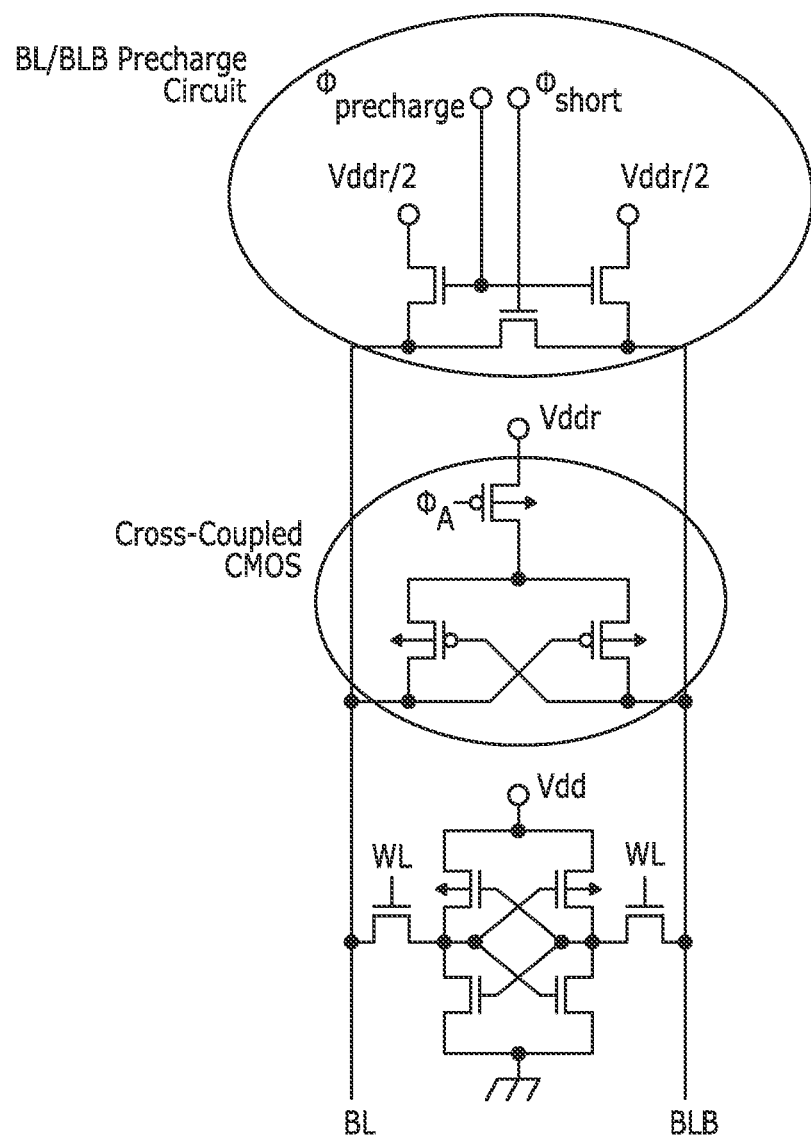
FIG. 15a shows a BL/BLB precharge (EQ) and cross-coupled PMOS structure for 6T SRAM, according to an embodiment.

In FIG. 15a, the cross-coupled PMOS structure comprises three PMOS transistors; the source of one PMOS transistor being connected to Vddr, the gate being connected to the cross-coupled enable signal, ΦA, and the drain being connected to the source of two other PMOS transistors. The drain of one PMOS transistor is connected to BL and the gate is connected to BLB, and the drain of the other PMOS transistor is connected to BLB and the gate is connected to BL.

Figure 15B:
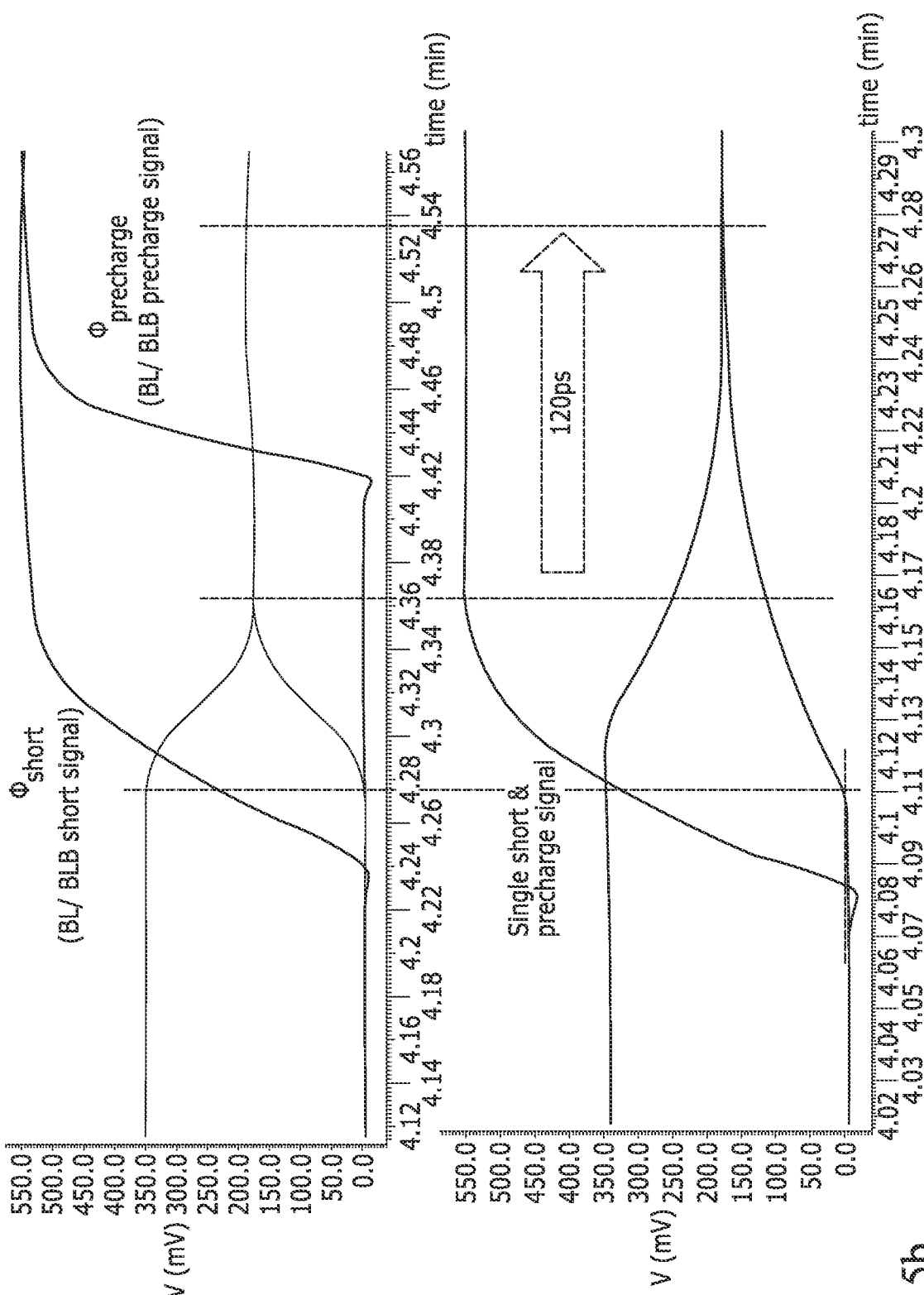
FIG. 15b shows separation of the Φprecharge and Φshort, signals for the BL/BLB precharge (EQ) structure of FIG. 15a, FIG. 15c shows timing signals for WL high, BL and BLB with Vdd reduced to Vddr in read mode
Figure 15C:
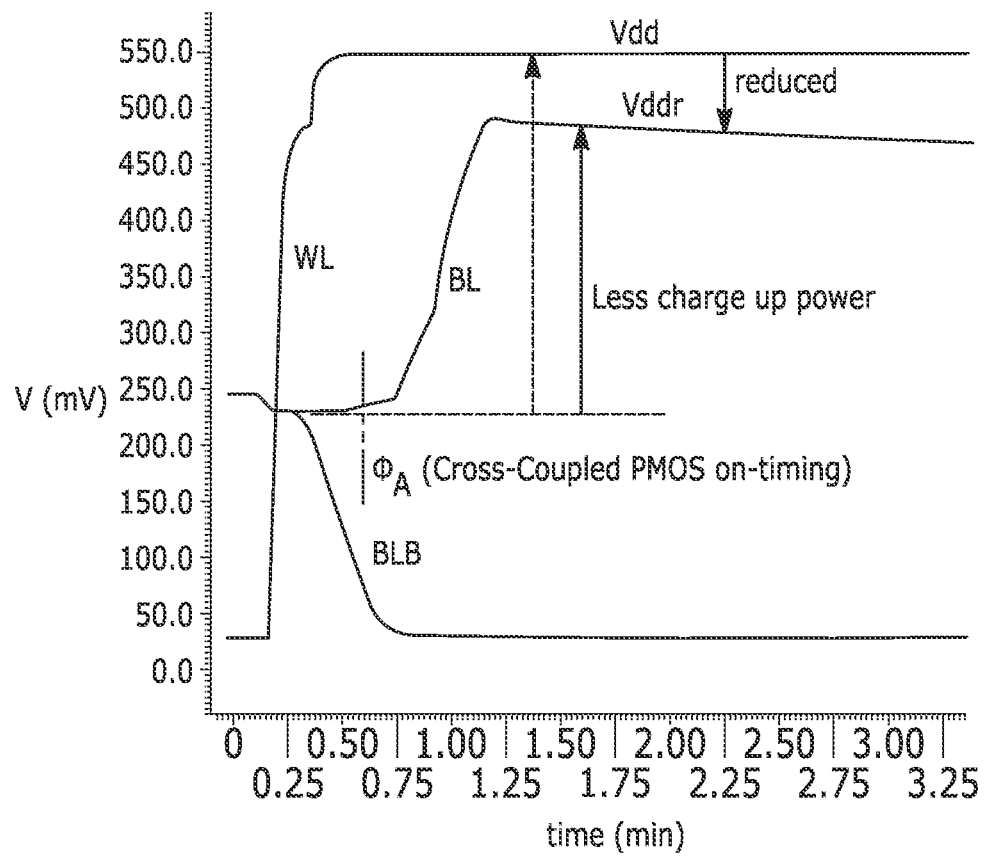
FIG. 15d shows timing signals for WL high, BL and BLB with Vdd reduced to Vddr in write mode.

In the case of a low Vdd, such as 0.55V, with a non-boosted WL in read, read BL High is not amplified and stays at the half precharge level, as shown in FIG. 15c before the cross-coupled enable signal, ΦA, is applied, because a non-boosted WL voltage is not enough to turn on the WL transistor of the 6T SRAM. Meanwhile, BLB low is discharged from the half Vdd precharge level towards to Vss by the NMOS transistor of the 6T SRAM. When the BL and BLB waveforms split (about 100 mV), the cross-coupled enable signal, ΦA, is applied for pulling up BL High towards to Vddr. It should be noted that if Vddr is set to Vdd1, then one Vdd1 generator is enough to provide both Vdd1 and Vddr. The BL precharge level after read should be Vddr/2 rather than Vdd/2. For example. Where Vdd=550 mV, and Vddr=470 mV, the precharge level is 235 mV, rather than 275 mV. This 40 mV difference impacts the BL and BLB precharge speed.

The BL/BLB precharge circuit of FIG. 15a uses NMOS transistors to make the BL/BLB precharge speed faster than that of PMOS because Vgs of a short circuited NMOS is 550 mV (=550–0), whereas Vgs of a short circuited PMOS is −470 mV (=0–470). Moreover, as shown in FIG. 15b, the use of two different signals to the BL/BLB precharge circuit, Φprecharge and Φshort, requires that Φshort be applied first and thereafter Φprecharge is applied to make the BL/BLB short and precharge speed fast (BL/BLB short is 120 ps faster than that of a conventional single BL/BLB short and precharge signal circuit).

Figure 15D:
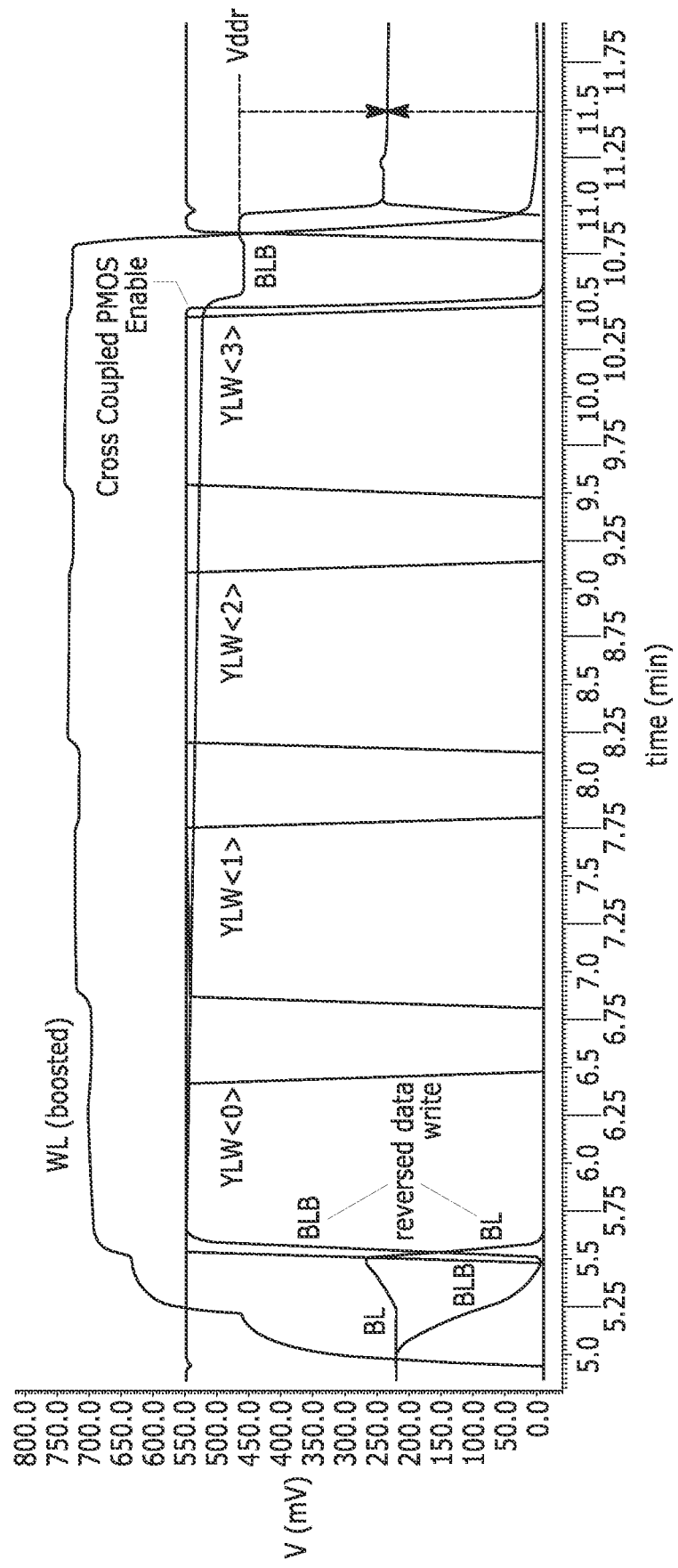

It should be noted that the sources of the precharge PMOS transistors are connected to Vddr/2, rather than Vdd/2, which means the half Vdd generator outputs Vddr/2. For this, the BL precharge level after read should be Vddr/2, rather than Vdd/2. On the other hand, the BL precharge level after write is Vdd/2 because BL and BLB are split to Vdd and Vss during write. Therefore, after write the precharge level should be set to the same Vddr/2 as for read, to keep the read BL reference level at the midpoint of BL High (Vddr) and BLB Low (Vss). For this, the cross-coupled enable signal, ΦA, which is set to turn off during write, is configured to turn on at the final write switch activation (YLW<3>) as shown in the timing of the final write cycle shown in FIG. 15d, so that even after the write cycle, the precharge level is set to Vddr/2, as shown in FIG. 15c depicting the waveforms of Vddr of BL high in read, and FIG. 15d which shows the waveforms of Vddr of BL high in write. As discussed above, Vddr is supplied by the circuit shown in FIG. 15.

Figure 16A:
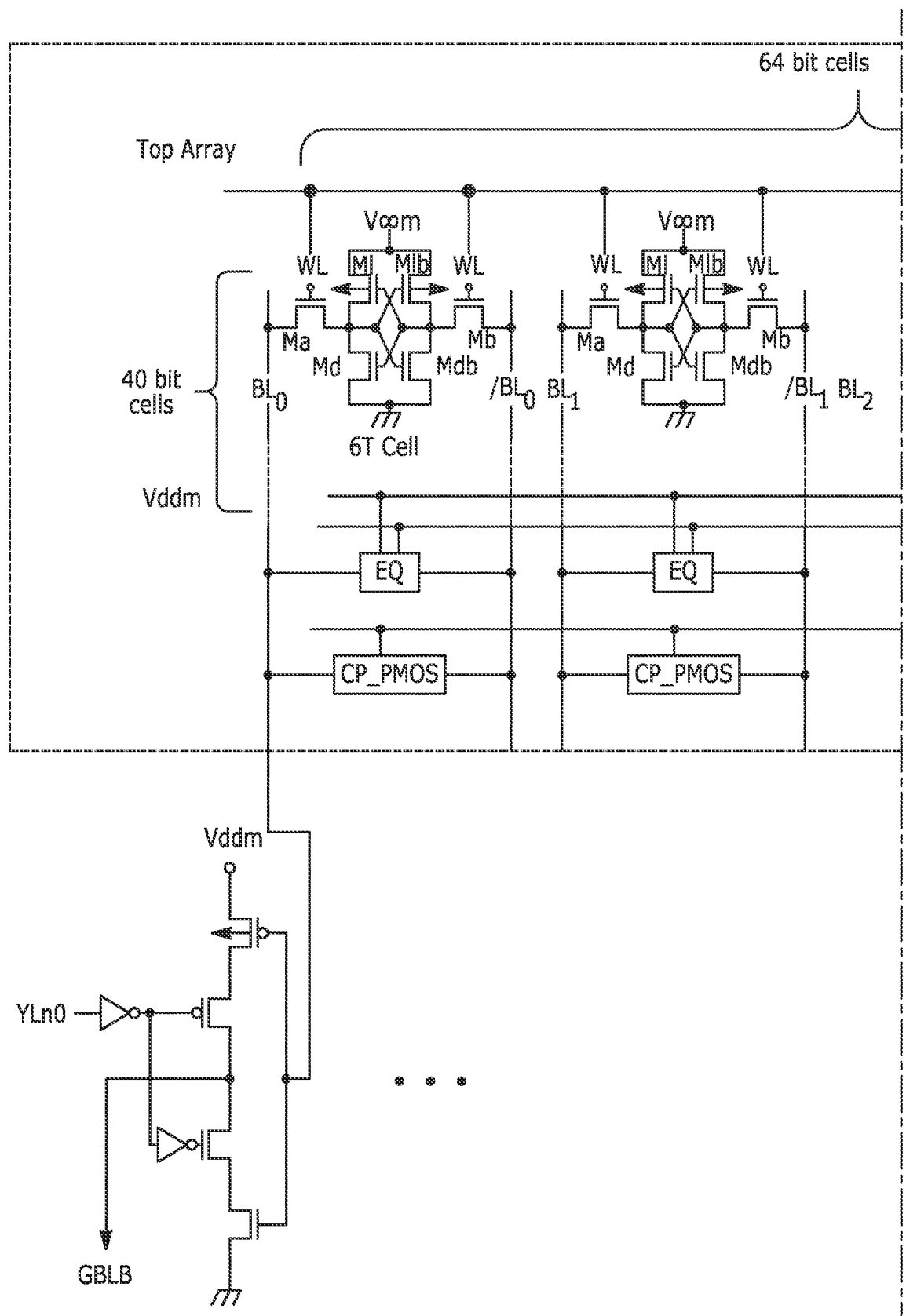
FIG. 16a shows the BL/BLB precharge (EQ) and cross-couple PMOS circuits of FIG. 15a incorporated into an array.
Figure 16A:
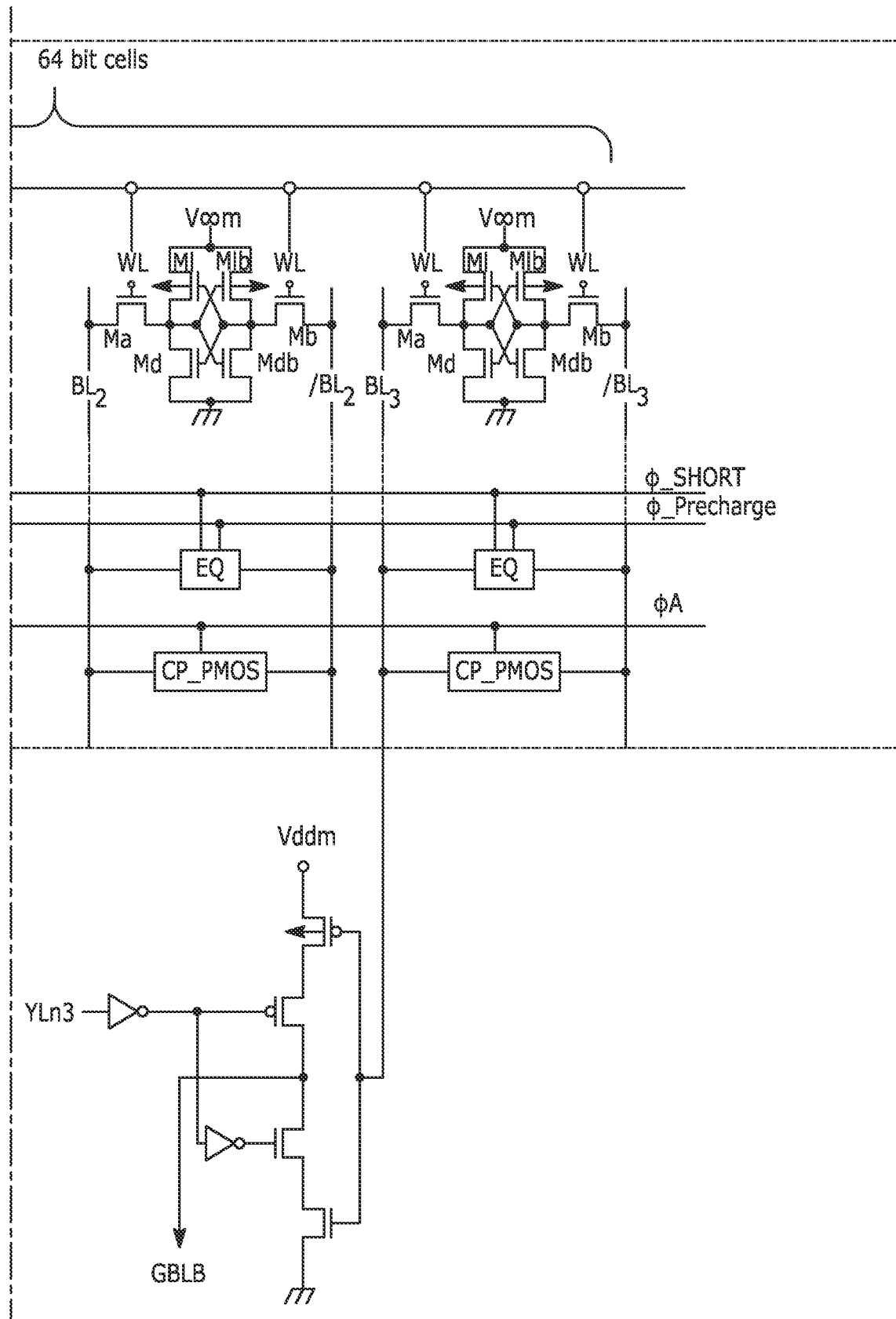
Figure 16A:
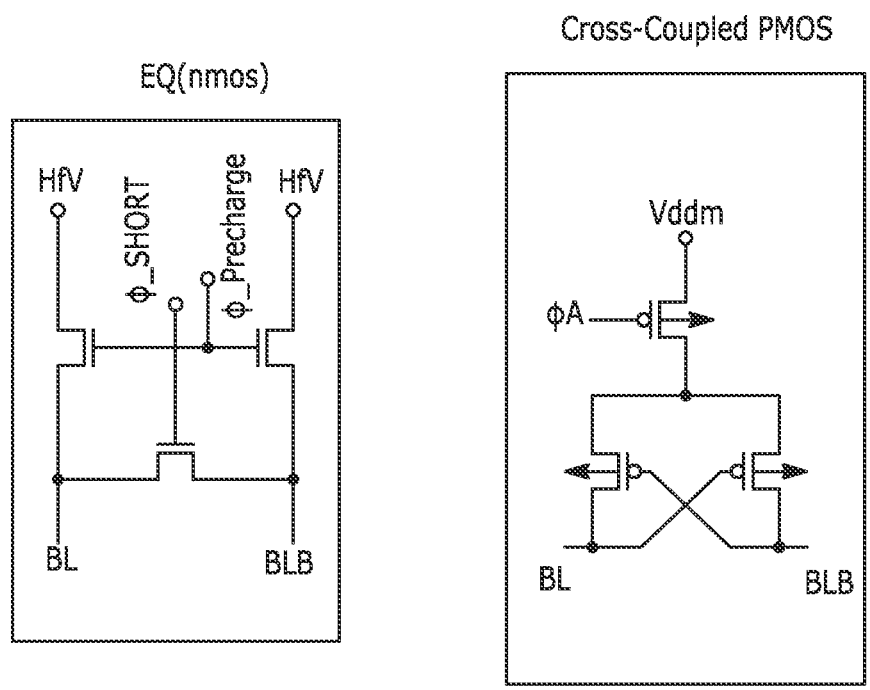
Figure 16B:
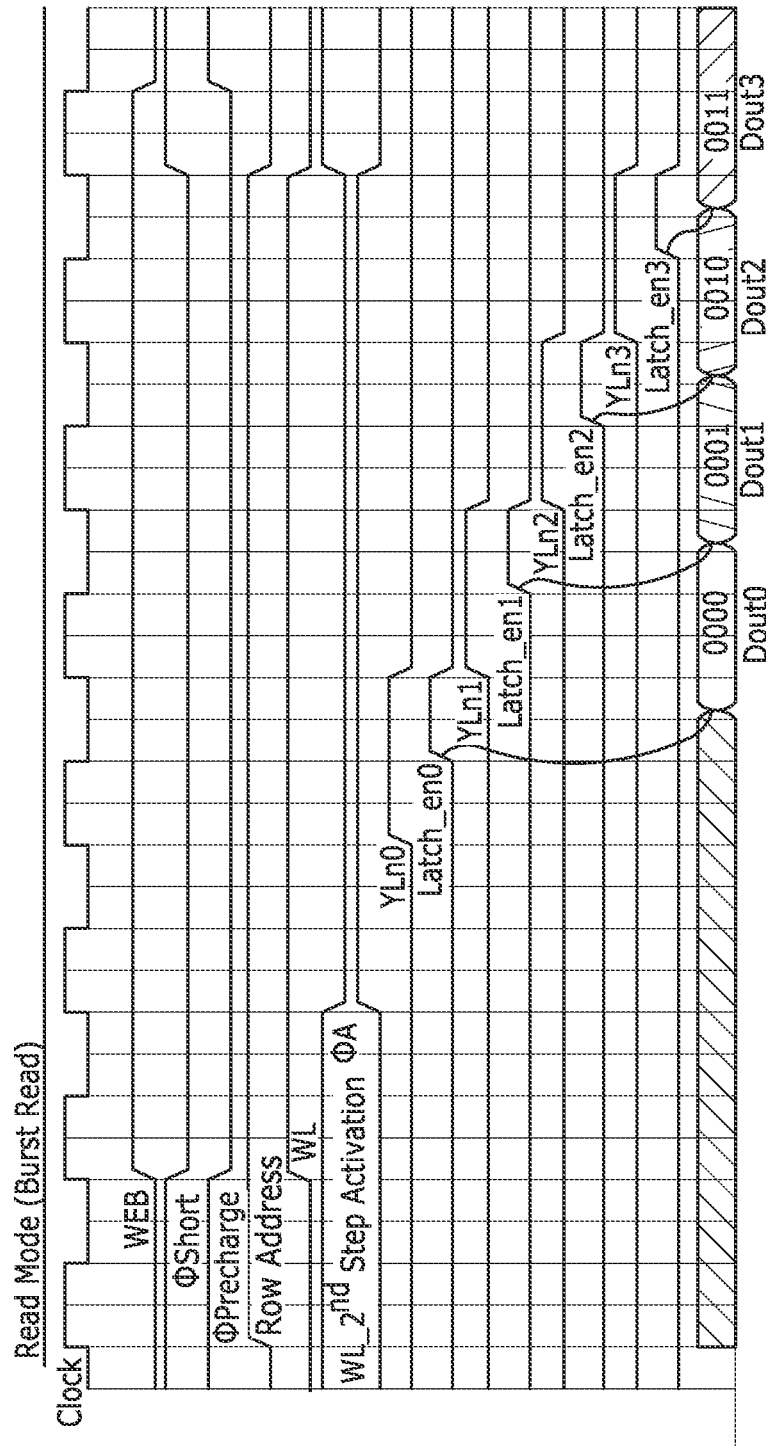
FIG. 16b, FIG. 16c and FIG. 16d depict timing diagrams for read mode (burst read), read mode (single bit read) and write mode (single bit write), respectively.
Figure 16C:
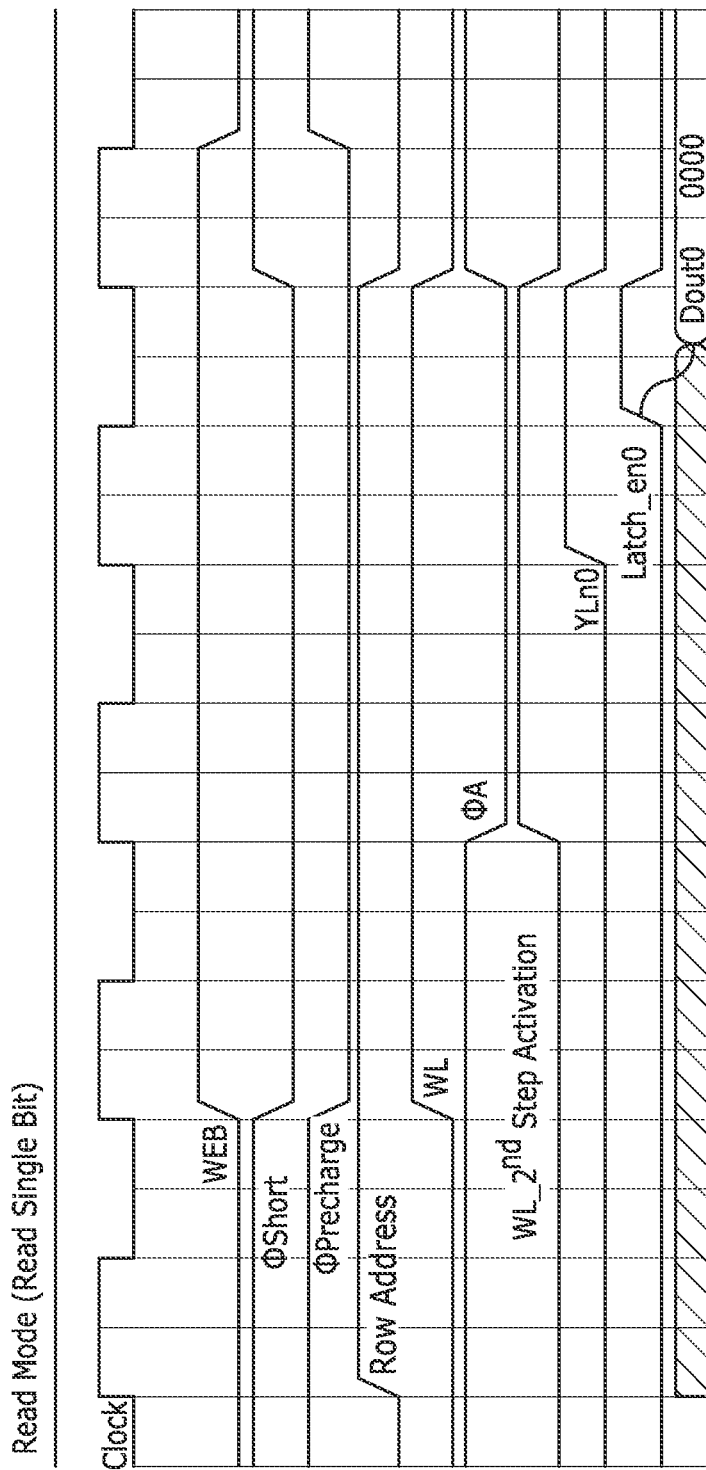
Figure 16D:
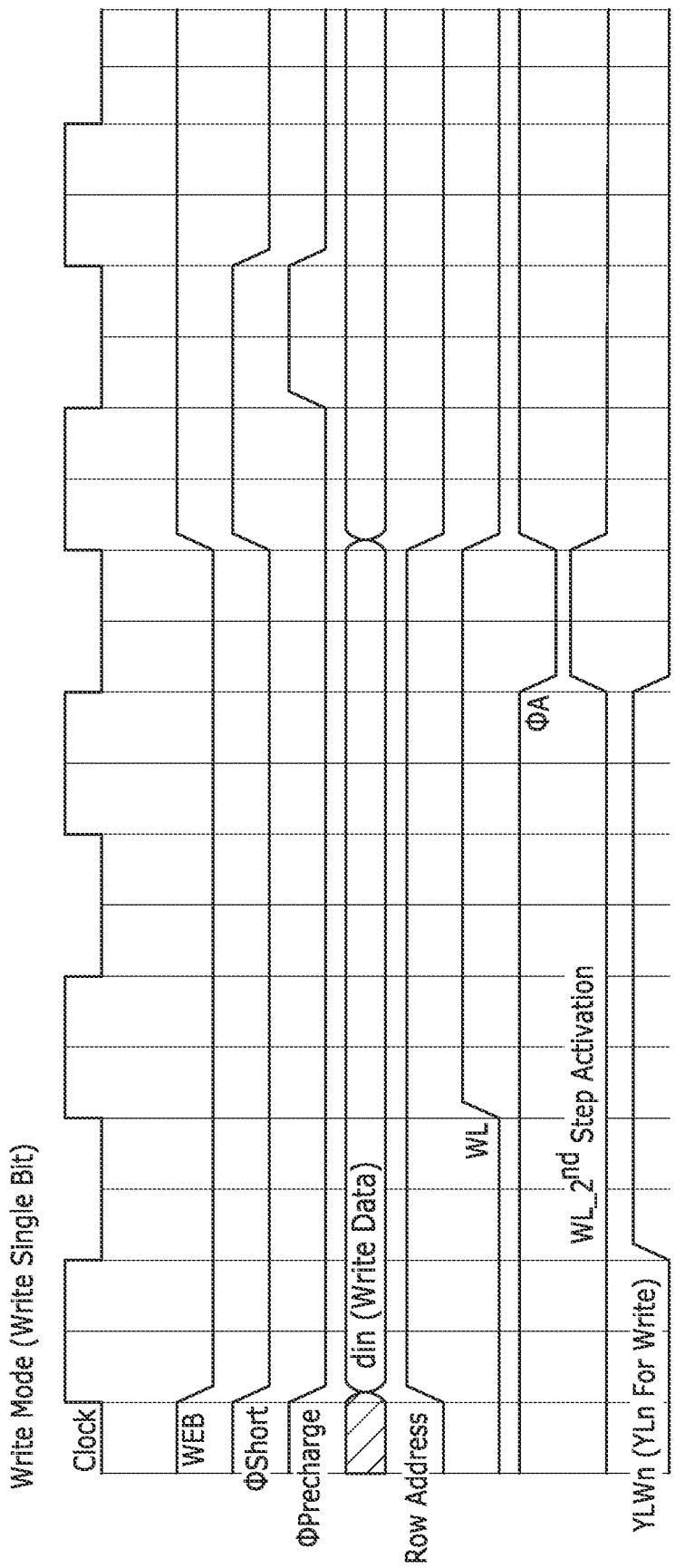

FIG. 16a shows the BL/BLB precharge (EQ) and cross-couple PMOS circuits of FIG. 15a incorporated into an array, while FIGS. 16b, c and d depict timing diagrams for read mode (burst read), read mode (single bit read) and write mode (single bit write), respectively.

Figure 17A:
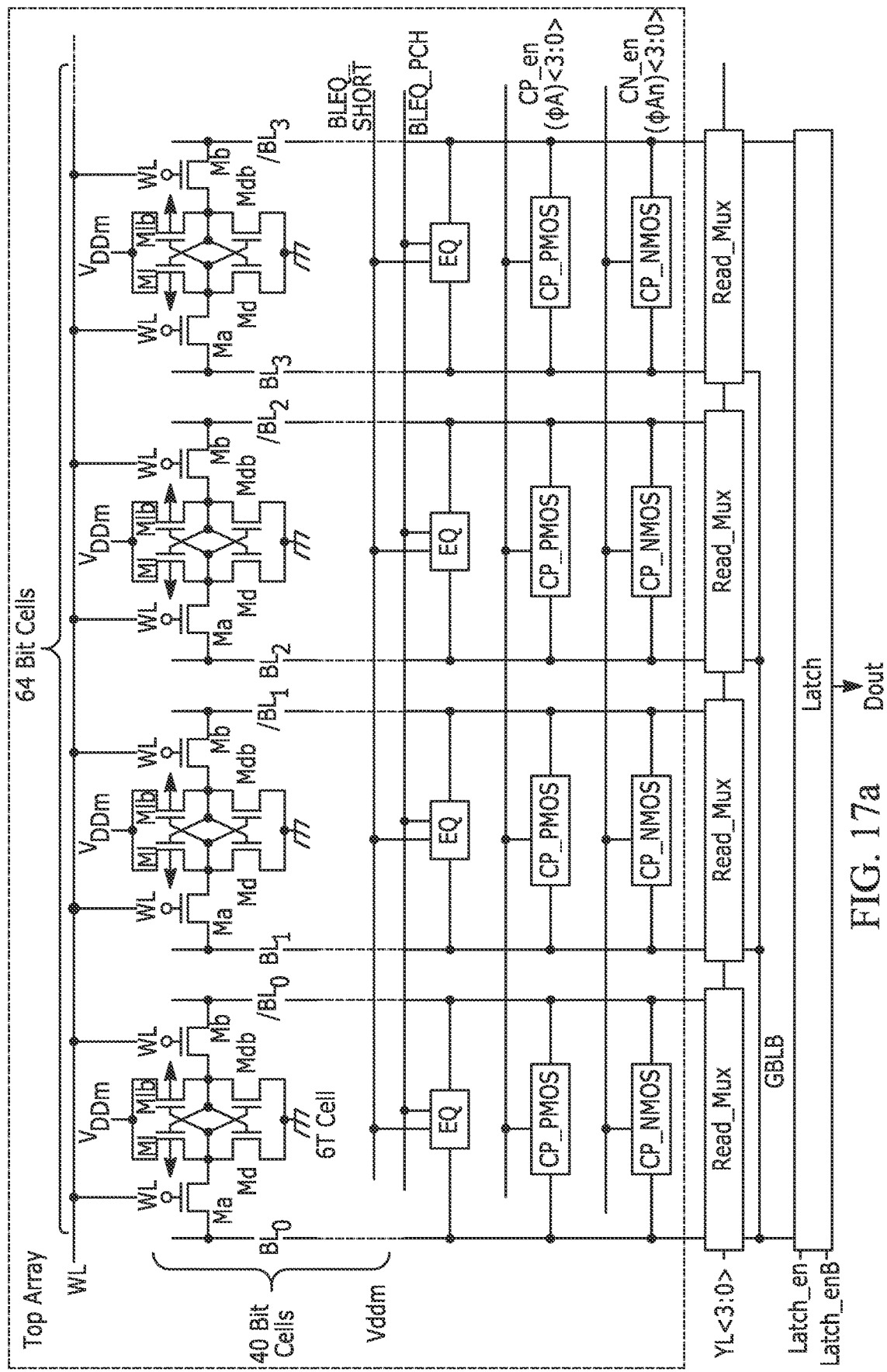
FIG. 17a shows a SRAM array of four columns multiplexed from 4 to 1.
Figure 17B:
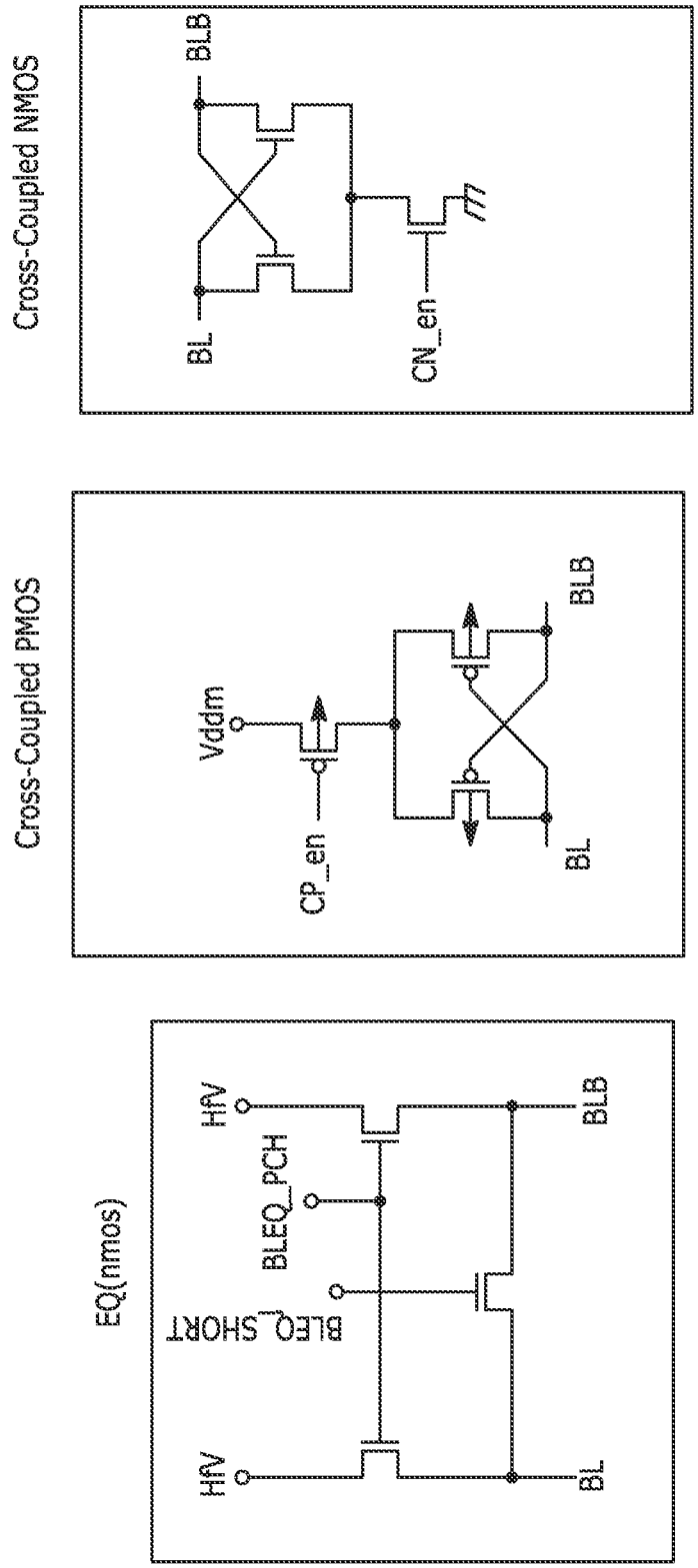
FIG. 17b shows details of a pre-charge circuit (EQ(nmos)) and cross-coupled PMOS and NMOS circuits of the array on FIG. 17a, FIG. 17c shows columns of the word line (WL) connected to an AI logic element using N:1 multiplexing.

In a further aspect, the word line boost circuit may include a plurality of boost capacitances equal in number to the multiplexed columns, in addition to the primary boost capacitance, wherein each boost capacitance is boosted according to timing of multiplexing (degenerated) column signals, as shown in FIGS. 17a and 17b, where FIG. 17a shows four columns being multiplexed from 4 to 1 by YL<3:0> and includes CP_(Cross coupled) NMOS as well as CP_PMOS for further strong BL amplification, and FIG. 17b shows details of the pre-charge circuit (EQ(nmos)) and cross-coupled PMOS and NMOS circuits.

Figure 17C:
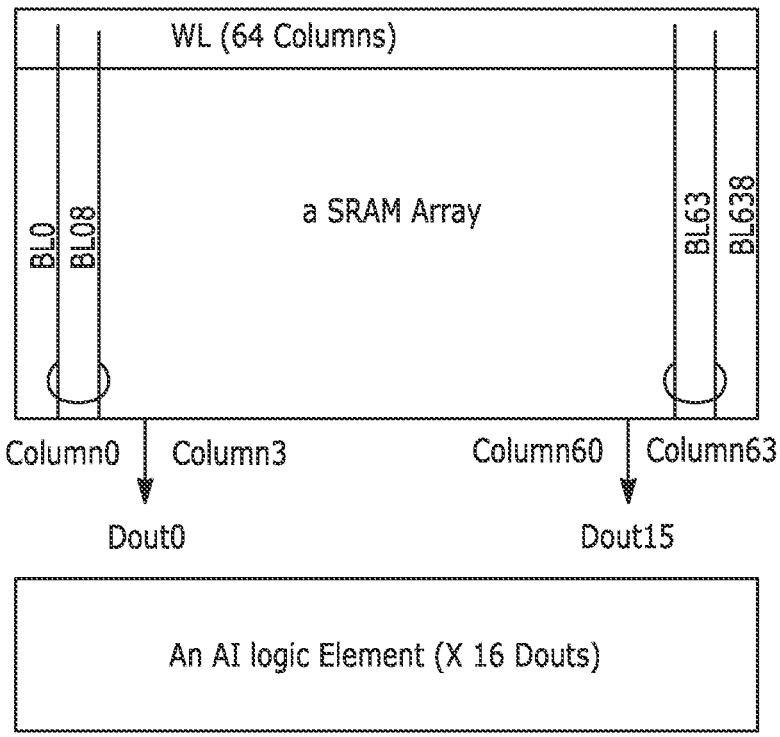
FIG. 17d shows a monitoring circuit to detect when the low data bit line signal drops to less than 10% of its precharge amplitude.
FIG. 17e is a timing diagram for operation of the monitoring circuit of FIG. 17d.
Figure 17D:
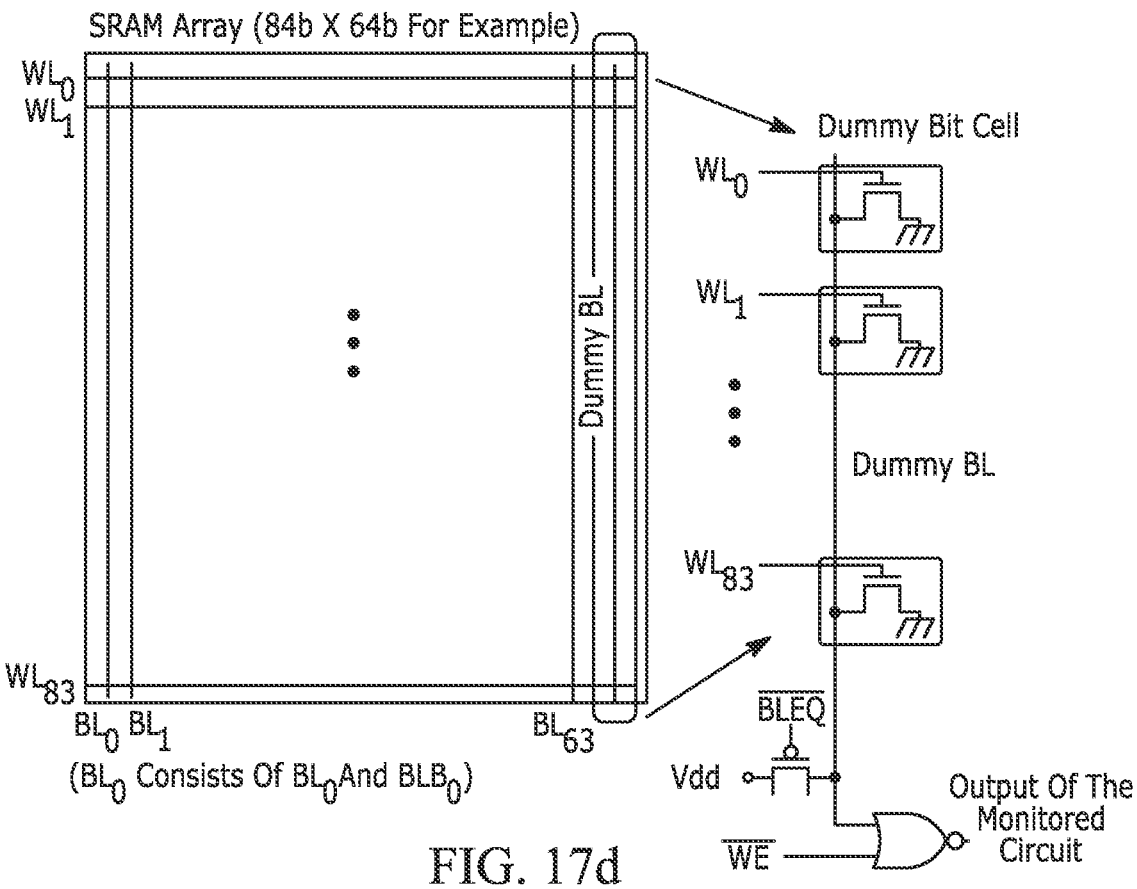
Figure 17E:
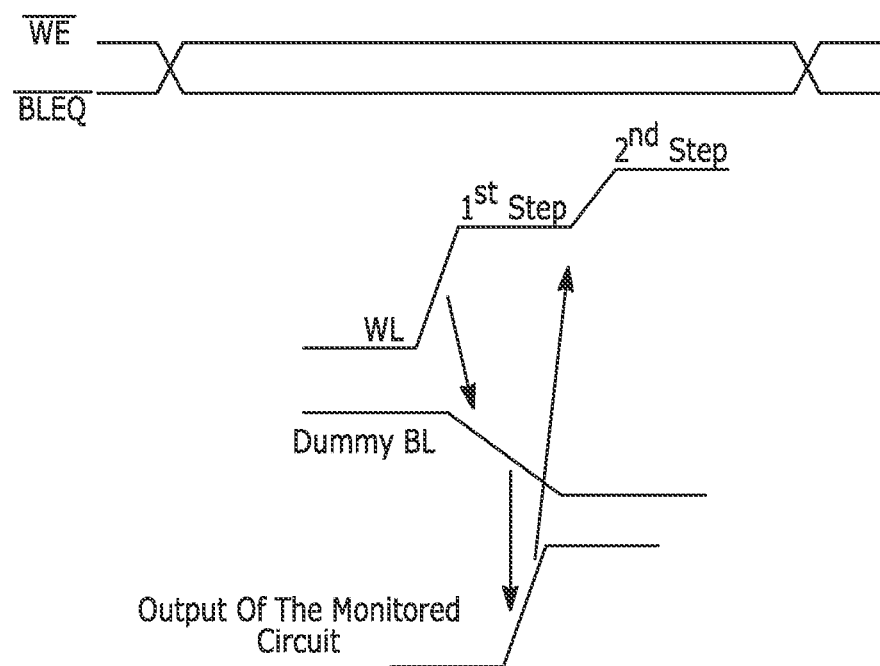

In an additional aspect, the columns of the word line (WL) may be connected to an AI logic element using N:1 multi-plexing, where N≥1. FIG. 17c shows column multiplexing of <3:0>(N=4), where a data latch is located every N columns for reading data, and wherein CP_en and CN_en in FIG. 17a consist of the N phases, and CP_en of each phase is activated by the output of a monitoring circuit, as shown in FIG. 17d, where FIG. 17e is a timing diagram for operation of the monitoring circuit of FIG. 17d. The CN_en of each phase is activated after the activation of the corresponding CP_en.

Figure 18A:
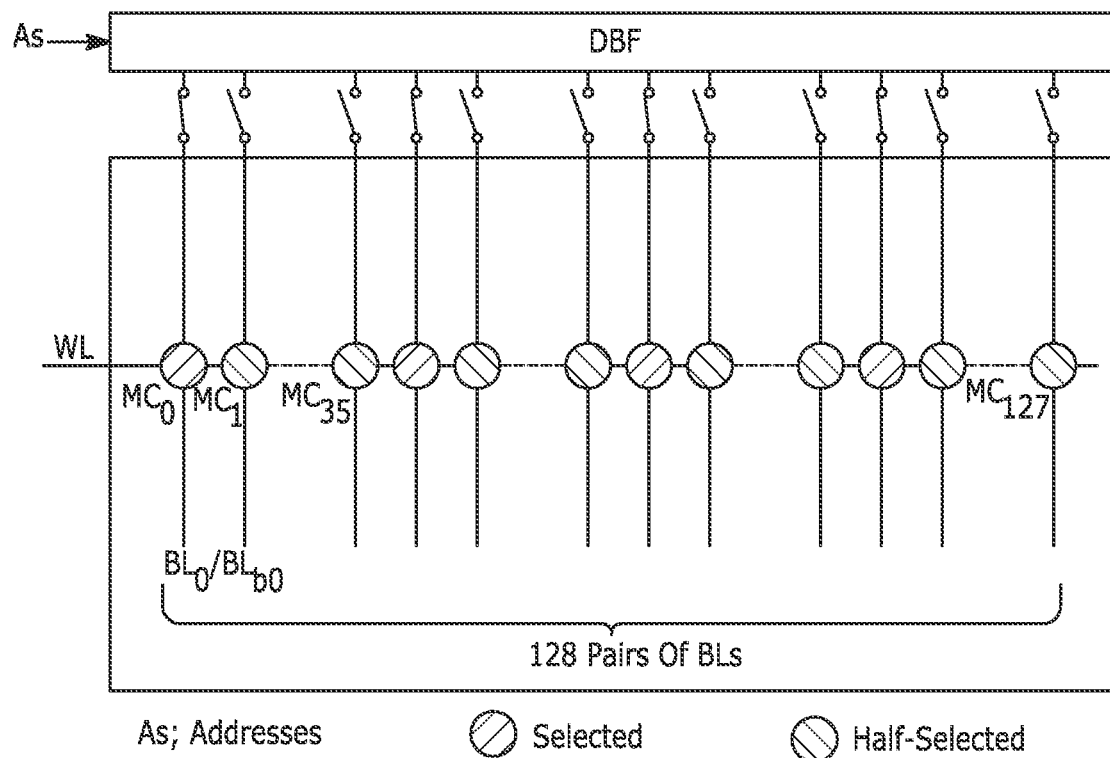
FIGS. 18a and 18b show array configurations and controls of traditional SRAMs and emerging SRAMs, respectively.
Figure 18B:
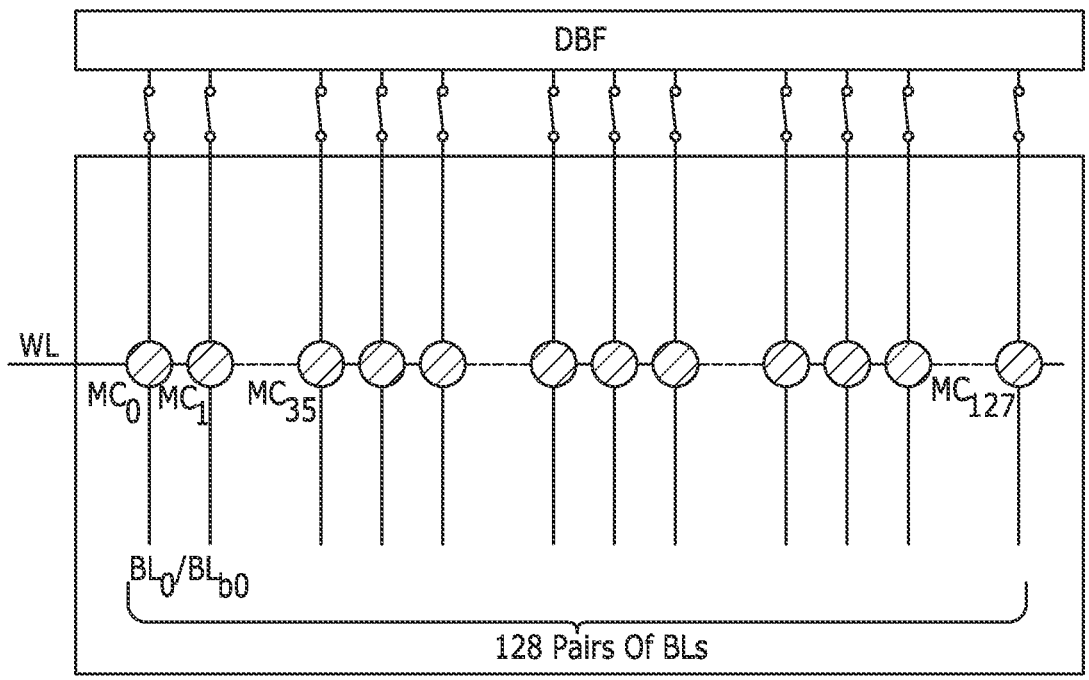

To further explore the nature of the write operation for different types of SRAMs, namely, traditional SRAMs or emerging SRAMs, FIGS. 18a and 18b show array configurations and controls of traditional SRAMs and emerging SRAMs, respectively. In FIGS. 18a and 18b, each BL of each MC comprises a pair of BLs as shown in FIG. 2a. For traditional SRAMs, a few MCs along a selected WL are simultaneously read or written and communicate with a data-in and data-output buffer block (DBF). The remainder of the MCs, referred to as half-select MCs, are effectively (virtually) read without any communication with the DBF. The characteristics of the half-select MCs are almost the same as the actually-read MCs, and they must be stable and wide in margin during the WL-selection. Hence, read and write operations are mixed during one WL-selection of the WL. For example, 4 MCs of 128 MCs along a selected WL are actually read from or written to while the rest of MCs (i.e. 124 half-select MCs) are virtually read. Hence, the WL-pulse must be common to the selected MCs and half-select MCs, regardless of read or write of the 4 MCs. For emerging SRAMs, all of the MCs along the WL are simultaneously read from or written to without any half-select MCs. Thus, $V_{WR}$ and $V_{WW}$ can be different during one WL-selection. However, for emerging SRAMs, in the case of a mask write function, a number of MCs are half-selected. Thus, various combinations are allowed to ensure wide margins for both read and write operations.

The use of boosted $V_{WW}$ can reduce BL-power for both traditional and emerging SRAMs. For NBL, discussed above, in addition to increased BL-power and area, achieving NBL under H-BP requires sophisticated circuits for traditional SRAMs, due to a small total write power from a few MCs (e.g., 4 MCs), despite the high power for a single MC caused by NBL. On the other hand, NBL is not suitable for emerging SRAMs due to the above-mentioned high power. Based on the foregoing, allowable combinations of $V_{WR}$ and $V_{WW}$ for successful read and write are depicted in Table A, as follows:

TABLE A

|  | Read | Write | Comb. of $V_{WR}$ and $V_{WW}$ |
|---|---|---|---|
| Traditional SRAMs | Non-boosted $V_{WR}$ | Non-boosted $V_{WW}$ | Possible with N-BL |
|  | Non-boosted $V_{WR}$ | Boosted $V_{WW}$ | Possible with two steps WL |
|  | Boosted $V_{WR}$ | Non-boosted $V_{WW}$ | Impossible |
|  | Boosted $V_{WR}$ | Boosted $V_{WW}$ | Possible with two steps WL |
| Emerging SRAMs | Non-boosted $V_{WR}$ | Non-boosted $V_{WW}$ | Impossible |
|  | Non-boosted $V_{WR}$ | Boosted $V_{WW}$ | Possible with two steps WL |
|  | Boosted $V_{WR}$ | Non-boosted $V_{WW}$ | Impossible |
|  | Boosted $V_{WR}$ | Boosted $V_{WW}$ | Possible with two steps WL |

Thus, for traditional SRAMs there are four possibilities: 1) non-boosted $V_{WR}$ and non-boosted $V_{WW}$, which is possible due to wide margins for read and write with N-BL. (2) Non-boosted $V_{WR}$ and boosted $V_{WW}$, which is possible with two steps WL-pulses due to half-select MCs. (3) Boosted $V_{WR}$ and non-boosted $V_{WW}$, which is impossible due to the need for different WL-pulse for read and write. (4) Boosted $V_{WR}$ and boosted $V_{WW}$, which is possible with two steps WL-pulses.

Likewise, for emerging SRAMs there are four possibilities: 1) Non-boosted $V_{WR}$ and non-boosted $V_{WW}$, which is impossible due to difficult write without NBL. NBL increases the power. (2) Non-boosted $V_{WR}$ and boosted $V_{WW}$, which is possible with two step WL-pulses. (3) Boosted $V_{WR}$ and non-boosted $V_{WW}$, which is impossible due to difficult write without NBL. NBL increases the power. (4) Boosted $V_{WR}$ and boosted $V_{WW}$, which is possible with two step WL-pulses.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A static random-access memory comprising:
    a word line circuit for generating a word line signal on a word line;
    a plurality of six-transistor memory cells arranged between a first bitline, a second bitline and the word line for simultaneously selecting one of either all or a portion of the plurality of six-transistor memory cells for data reading or writing, and wherein each memory cell comprises:
    a first inverter;
    a second inverter, the first inverter and the second inverter configured to operate at a power supply voltage (Vdd);
    a first n-channel transistor having a gate for receiving the word line signal on the word line and in response connecting a first output of the first inverter to the first bitline;
    a second n-channel transistor having a gate for receiving the word line signal on the word line and in response connecting a second output of the second inverter to the second bitline; and
    a bitline precharge circuit for precharging the first bitline and second bitline to a voltage of Vdd/2 prior to the first and second n-channel transistors receiving the word line signal, wherein the word line circuit selects a portion of the plurality of six transistor memory cells along a selected word-line for simultaneous data reading or writing, and comprises a first PMOS transistor, a second PMOS transistor and an NMOS transistor,
    wherein the first PMOS transistor has a drain connected to the word line, a source connected to a first power supply voltage Vdd1 less than Vdd and greater than Vdd/2 when reading and writing to said memory cell, and a gate for receiving a first control signal (A),
    wherein the second PMOS transistor has a drain connected to the word line, a source connected to one of either Vdd when reading said memory cell or a boosted voltage Vdd_boost when writing to said memory cell, and a gate for receiving one of either a second control signal (B) or third control signal (B'), and
    wherein the NMOS transistor has a drain connected to the word line, a source connected to a low power supply voltage reference (Vss), and a gate connected to a third control input (WL_clear), such that the word line signal is provided in two steps including: a first step where in response to receiving the first control signal (A) the amplitude is at the first power supply voltage (Vdd1) when reading and writing to said memory cell; and a second step, following the first step, where in response to receiving the second control signal (B) the amplitude is at the power supply voltage (Vdd) when reading said memory cell or where in response to receiving the third control signal (B') the amplitude is at the boosted voltage Vdd_boost when writing to said memory cell.

2. The static random-access memory of claim 1, wherein the first power supply voltage (Vdd1) is generated by one of either an on-chip voltage generator, an on-chip voltage divider or an external voltage, wherein the on-chip voltage generator comprises: a driver path having two sets of a source follower and driver in parallel; and a sink path having two source followers in series, wherein drivability of transistors of the sink path is weaker than respective drivability of transistors of the driver path.

3. A static random-access memory comprising:
    a word line circuit for generating a word line signal on a word line;
    a plurality of six-transistor memory cells arranged between a first bitline, a second bitline and the word line for simultaneously selecting one of either all or a portion of the plurality of six-transistor memory cells for data reading or writing, and wherein each memory cell comprises:
    a first inverter;
    a second inverter, the first inverter and the second inverter configured to operate at a power supply voltage (Vdd);

a first n-channel transistor having a gate for receiving the word line signal on the word line and in response connecting a first output of the first inverter to the first bitline;

a second n-channel transistor having a gate for receiving the word line signal on the word line and in response connecting a second output of the second inverter to the second bitline; and a bitline precharge circuit for precharging the first bitline and second bitline to a voltage of Vdd/2 prior to the first and second n-channel transistors receiving the word line signal, wherein the word line circuit selects all of the plurality of six transistor memory cells along a selected word-line for simultaneous data reading or writing, and wherein the amplitude of the word line signal when reading said memory cells is at Vdd, and the amplitude of the word line signal when writing to said memory cells is boosted larger than Vdd, and the rise time of the word line signal when reading said memory cells and writing to said memory cells is slower than the fall time to reduce a peak of low data stored in the bit cells when the word line signal is less than 20% of the Vdd/2 precharge voltage, and wherein the slower rise time is slow enough to raise the first bitline voltage to more than 50 mV with a split between the first and second bitline voltages when the word line signal reaches more than 90% of its maximum amplitude, and wherein the word line circuit includes a monitoring circuit having resistance and capacitance to detect when the low data bit line signal reaches less than 10% of its precharge amplitude.

4. The static random-access memory of claim 3, wherein the word line signal is provided in two steps including: a first step where the amplitude is at a first power supply voltage Vdd1 when reading and writing to said memory cell; and a second step, following the first step, where the amplitude is at the power supply voltage Vdd when reading said memory cell or is at a boosted voltage Vdd_boost when writing to said memory cell, and wherein the second step is provided when the difference between the first bitline and second bitline voltages is sufficient to compensate for SNM(Static Noise Margin) of the second step, and wherein the slower rise time of the word line signal is applied to the first step word line where Vdd is applied during both read and write and the start of the second step whose amplitude is boosted during write, is determined by an output of the monitoring circuit, and wherein the rise time of the second step is slower than the rise time of the first step.

5. The static random-access memory of claim 4, wherein the first power supply voltage Vdd1 is generated by one of either an on-chip voltage generator, an on-chip voltage divider or an external voltage, wherein the on-chip voltage generator comprises: a driver path having two sets of a source follower and driver in parallel; and a sink path having two source followers in series, wherein drivability of sink path is weaker than respective drivability of transistors of the driver path.

6. The static random-access memory of claim 4, further including a word line boost circuit for precharging a primary boost capacitance of the word line circuit during the first step, and further boosting the primary boost capacitance at the second step.

7. The static random-access memory of claim 6, wherein the word line boost circuit includes a plurality of boost capacitances equal in number to multiplexed columns, in addition to the primary boost capacitance, and wherein each boost capacitance is boosted according to timing of multiplexing column signals.

8. The static random-access memory of claim 3, wherein a voltage Vddr is applied to one of the first bitline or second bitline during data reading wherein Vddr is equal to or less than the power supply voltage Vdd, and wherein the voltage Vddr is driven by cross-coupled first and second PMOS transistors and a third PMOS transistor, wherein a source of the first cross-coupled PMOS transistor is connected to the voltage Vddr, a gate of the first cross-coupled PMOS transistor is configured to receive a cross-coupled enable PMOS signal (ΦA), and a drain of the first cross-coupled PMOS transistor is connected to respective sources of the second cross-coupled PMOS transistor and the third PMOS transistor, wherein a drain of the second cross-coupled PMOS transistor is connected to the first bitline and a gate of the second cross-coupled PMOS transistor is connected to the second bitline, wherein a drain of the third PMOS transistor is connected to the second bitline and a gate of the third PMOS transistor is connected to the first bitline, wherein the cross-coupled enable PMOS signal (CP_en) is applied no earlier than the second step, wherein a first source of the first NMOS transistor is connected to a Vss, a first gate of the first NMOS transistor is configured to receive a cross-coupled enable NMOS signal (CN_en), and a first drain of the first NMOS transistor is connected to respective sources of the second NMOS transistor and the third NMOS transistor, wherein a second drain of the second NMOS transistor is connected to the first bitline and a second gate of the second NMOS transistor is connected to the second bitline, wherein a third drain of the third NMOS transistor is connected to the second bitline and a third gate of the third NMOS transistor is connected to the first bitline, and CN_en is applied after CP_en is applied.

9. The static random-access memory of claim 8, wherein the voltage Vddr is less than the power supply voltage Vdd, and is generated by one of either an on on-chip voltage generator, an on-chip voltage divider or an external voltage, wherein the on-chip voltage generator comprises: a driver path having two sets of a source follower and driver in parallel; and a sink path comprising two source followers in series, wherein drivability of transistors of the sink path is weaker than respective drivability of transistors of the driver path.

10. The static random-access memory of claim 8, wherein the voltage Vddr is less than the power supply voltage Vdd, and is generated by one of either an on on-chip voltage generator, an on-chip voltage divider or an external voltage, wherein the on-chip voltage generator is supplied by an external voltage.

11. The static random-access memory of claim 8, wherein the first PMOS transistor is turned on by the cross-coupled enable signal (CP_en), during a final portion of data writing.

12. The static random-access memory of claim 8, wherein the columns of a word line are connected to an AI logic element by N:1 Muxing (N≥1), wherein, a data latch s provided every N columns for reading data, wherein CP_en and CN_en consist of N phases, and CP_en of each phase is activated by an output of the monitoring circuit and CN_en of each phase is activated after the corresponding CP_en.

\* \* \* \* \*